United States Patent
Yanagidaira

(10) Patent No.: US 9,953,714 B2
(45) Date of Patent: Apr. 24, 2018

(54) SEMICONDUCTOR DEVICE

(71) Applicant: TOSHIBA MEMORY CORPORATION, Tokyo (JP)

(72) Inventor: Kosuke Yanagidaira, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/409,353

(22) Filed: Jan. 18, 2017

(65) Prior Publication Data

US 2017/0365347 A1    Dec. 21, 2017

(30) Foreign Application Priority Data

Jun. 15, 2016 (JP) .................................. 2016-118894

(51) Int. Cl.
*G11C 16/30* (2006.01)
*G11C 16/26* (2006.01)

(52) U.S. Cl.
CPC .............. *G11C 16/26* (2013.01); *G11C 16/30* (2013.01)

(58) Field of Classification Search
CPC ............................ G11C 11/4074; G11C 16/30
See application file for complete search history.

(56) References Cited

U.S. PATENT DOCUMENTS

| | | | | |
|---|---|---|---|---|
| 5,397,934 A * | 3/1995 | Merrill | ................... | G05F 3/242 327/534 |
| 5,604,467 A * | 2/1997 | Matthews | .............. | H03K 3/011 323/907 |
| 5,889,430 A * | 3/1999 | Csanky | .................. | G05F 3/262 323/315 |
| 6,075,404 A | 6/2000 | Shindoh et al. | | |
| 6,178,136 B1 * | 1/2001 | Lin | ...................... | G11C 7/1048 365/190 |
| 6,990,029 B2 | 1/2006 | Hardee | | |
| 7,936,208 B2 | 5/2011 | Clements et al. | | |
| 2001/0011911 A1 * | 8/2001 | Isoda | .................. | H03K 17/693 327/108 |
| 2005/0116765 A1 | 6/2005 | Sakiyama et al. | | |
| 2008/0180070 A1 * | 7/2008 | Kushima | .................. | G05F 3/30 323/233 |
| 2011/0234198 A1 * | 9/2011 | Lin | ..................... | H03M 1/0845 323/316 |

OTHER PUBLICATIONS

Taiwan Office Action dated Apr. 18, 2017 in related Taiwan Patent Application 105124482 with English Translation.

* cited by examiner

*Primary Examiner* — Hoai V Ho
*Assistant Examiner* — Jay Radke
(74) *Attorney, Agent, or Firm* — Patterson & Sheridan, LLP

(57) ABSTRACT

A semiconductor device includes a first circuit configured to generate a first voltage based on a first current, a second circuit that includes a first transistor of a first conductivity type having a first terminal, a second terminal, and a first gate, the second circuit configured to generate a second voltage based on a voltage difference between the first terminal and the second terminal, and a third circuit configured to compare the first voltage and the second voltage, and generate a third voltage for adjusting a substrate bias of the first transistor, based on the comparison result.

16 Claims, 19 Drawing Sheets

SEMICONDUCTOR DEVICE

CROSS-REFERENCE TO RELATED APPLICATION

This application is based upon and claims the benefit of priority from Japanese Patent Application No. 2016-118894, filed Jun. 15, 2016, the entire contents of which are incorporated herein by reference.

FIELD

Embodiments described herein relate generally to a semiconductor device.

BACKGROUND

A threshold voltage of a MOS transistor varies with change in temperature. There are situations where such variations of the threshold voltage become a problem.

DETAILED DESCRIPTION

Figure 1:
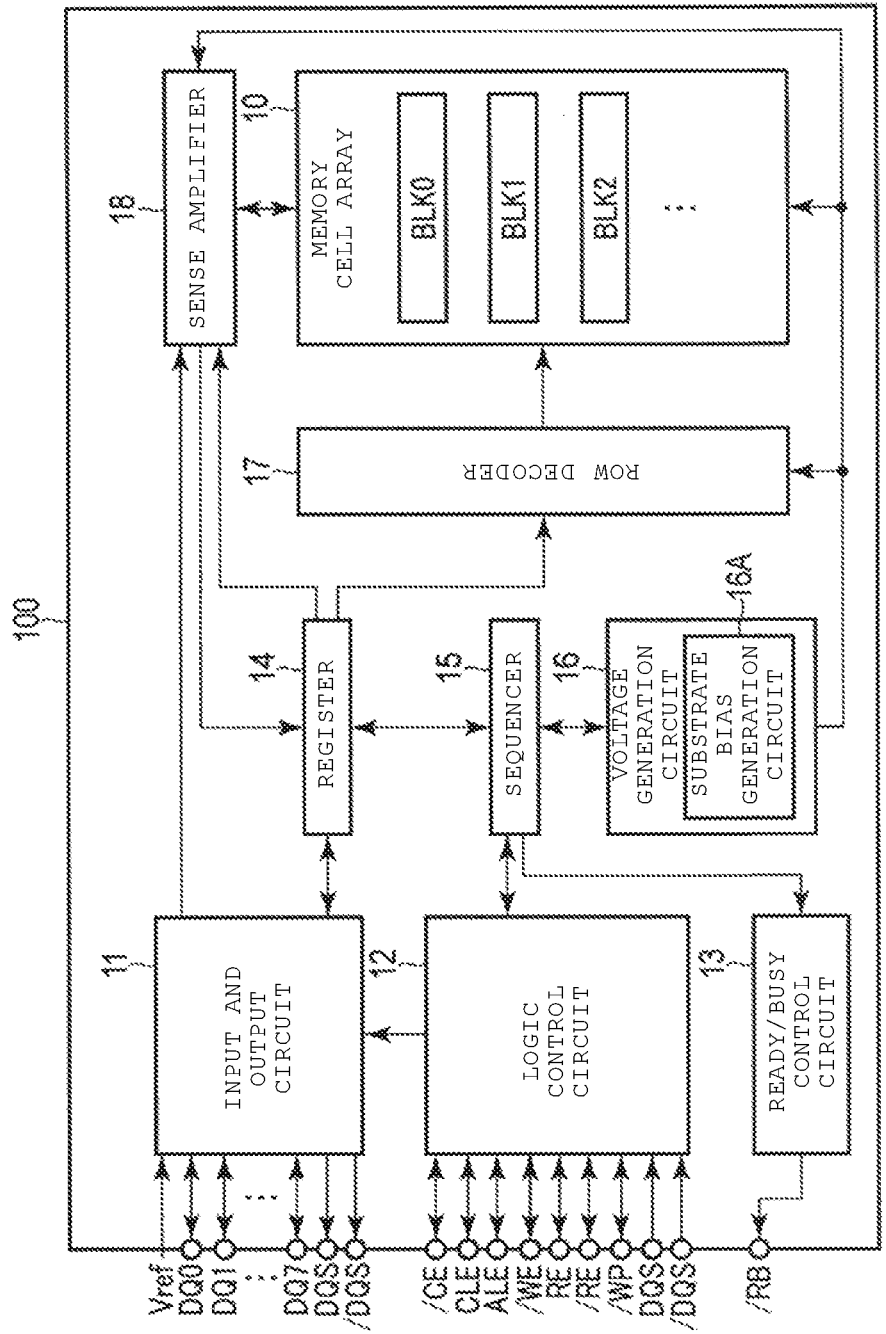
FIG. 1 is a diagram illustrating a semiconductor device according to a first embodiment.

In general, according to one embodiment, a semiconductor device includes a first circuit configured to generate a first voltage based on a first current, a second circuit that includes a first transistor of a first conductivity type having a first terminal, a second terminal, and a first gate, the second circuit configured to generate a second voltage based on a voltage difference between the first terminal and the second terminal, and a third circuit configured to compare the first voltage and the second voltage, and generate a third voltage for adjusting a substrate bias of the first transistor, based on the comparison result.

The present embodiments will be hereinafter described with reference to the drawings. The same symbols or reference numerals will be attached to elements with the same configuration in the drawings.

First Embodiment

Hereinafter, a semiconductor device (semiconductor memory device) according to a first embodiment will be described with reference to FIG. 1 to FIG. 11. Herein, a case where a semiconductor device is a NAND flash memory will be described, but the embodiments are not limited to this. In addition, in the following description, "connection" includes not only direct connection but also connection through one or more other elements. In addition, one terminal (first terminal) of a transistor indicates one of a source terminal and a drain terminal, and the other terminal (second terminal) of the transistor indicates the other of the source terminal and the drain terminal. In addition, a gate of the transistor indicates a gate terminal thereof.

Configuration Example of First Embodiment

First, a configuration example of a semiconductor device 100 according to the first embodiment will be described.

Figure 2:
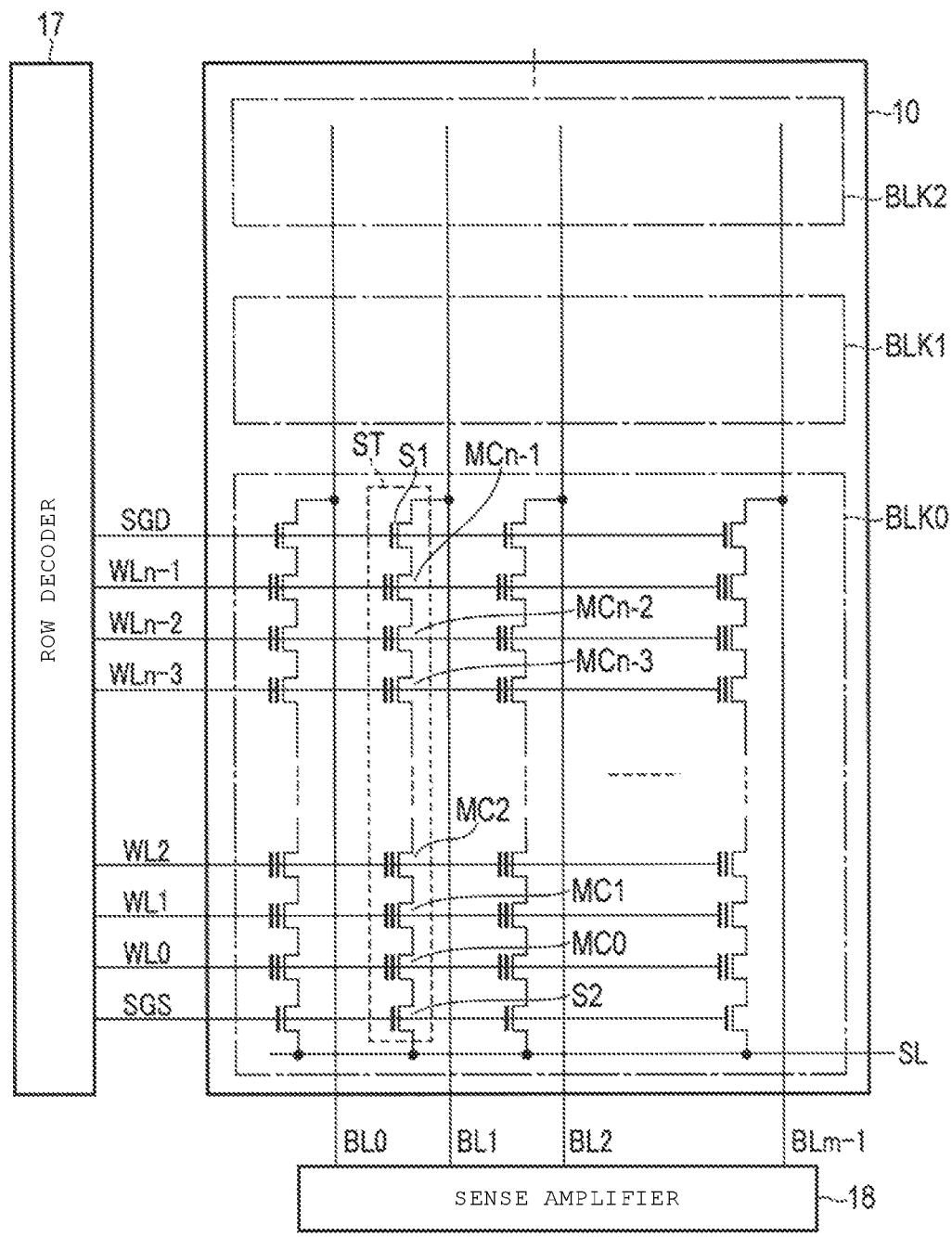
FIG. 2 is a diagram illustrating a memory cell array of the semiconductor device according to the first embodiment.

FIG. 1 is a diagram illustrating the semiconductor device 100 according to the first embodiment. FIG. 2 is a diagram illustrating a memory cell array 10 of the semiconductor device 100 according to the first embodiment.

As illustrated in FIG. 1, the semiconductor device 100 includes the memory cell array 10, an input and output circuit 11, a logic control circuit 12, a ready/busy control circuit 13, a register 14, a sequencer 15, a voltage generation circuit 16, a row decoder 17, and a sense amplifier 18.

The memory cell array 10 includes multiple blocks BLK (BLK0, BLK1, . . . ). More specifically, the block BLK0 includes multiple NAND strings ST, as illustrated in FIG. 2. Each NAND string ST includes, for example, n (n is an integer equal to or greater than 2) memory cell transistors MC (MC0 to MCn−1), and selection transistors S1 and S2.

The memory cell transistors MC (hereinafter, also referred to as a memory cell MC) includes a layered gate having a control gate and a charge storage layer, and retains data in a nonvolatile manner. Current paths of the memory cell transistors MC0 to MCn−1 are formed in series. One terminal of the memory cell transistor MCn−1 on one terminal side is connected to one terminal of the selection transistor S1, and one terminal of the memory cell transistor MC0 on the other terminal side is connected to one terminal of the selection transistor S2.

Gates of multiple selection transistors S1 are connected in common to a selection gate line SGD. Meanwhile, gates of multiple selection transistors S2 are connected in common to a selection gate line SGS. In addition, the gates of the memory cell transistors MC0 to MCn−1 are respectively connected in common to the word lines WL0 to WLn−1.

In addition, the other terminals of the selection transistors S1 of the NAND strings ST in the same column (across blocks BLK) among the NAND strings ST arranged in a matrix in the memory cell array 10 are connected in common to one of bit lines BL (BL0 to BLm−1, m is an integer equal to or greater than 2). In addition, the other terminals of the selection transistors S2 are connected in common to a source line SL. The source line SL is common within, for example, the multiple blocks BLK.

Data of the memory cell transistors MC in the same block BLK are erased, for example, collectively. In contrast to this, reading and writing of data are performed collectively from and to multiple memory cell transistors MC connected in common to one of the word lines WL of one of the blocks BLK. This data unit is called a "page".

Structures of the blocks BLK1 and BLK2 are the same as the block BLK0, and thus, description thereof will be omitted.

As illustrated in FIG. 1, the input and output circuit 11 receives and transmits signals DQ (DQ0 to DQ7) from and to an external device (controller 300) of the semiconductor device 100. The signals DQ include a command, an address, data, and the like. The input and output circuit 11 transmits the command and the address from the external device to the register 14. The input and output circuit 11 transmits write data from the external device to the sense amplifier 18, and transmits read data from the sense amplifier 18 to the external device. In addition, the input and output circuit 11 receives a voltage Vref from the external device. The voltage Vref is a reference voltage, and is a reference voltage for all operations. In addition, the input and output circuit 11 transmits data strobe signals DQS and /DQS to the external device together with the read data. The read data is read in synchronization with the signal DQS and /DQS.

The logic control circuit 12 receives various control signals from the external device, and controls the input and output circuit 11 and the sequencer 15. The control signals include, for example, a chip enable signal /CE, a command latch enable signal CLE, an address latch enable signal ALE, a write enable signal /WE, a read enable signal RE and /RE, and a write protection signal WP. The signal /CE enables the semiconductor device 100 to operate. The signals CLE and ALE respectively notify the input and output circuit 11 that the signals DQ are the command and the address. The signal /WE instructs the input and output circuit 11 to input the signals DQ. The signals RE and /RE instruct the input and output circuit 11 to output the signals DQ. The signal /WP makes the semiconductor device 100 enter a protection state, for example, when a power supply is connected or disconnected. In addition, the logic control circuit 12 receives the signals DQS and /DQS together with the write data. The write data is written in synchronization with the signal DQS and /DQS.

The ready/busy control circuit 13 notifies the external device of a state of the semiconductor device 100 by transmitting the signal /RB to the external device. The signal /RB indicates whether the semiconductor device 100 is in a ready state (state of being ready to receive the command from the external device) or in a busy state (state of not being ready to receive the command from the external device).

The register 14 retains the command and the address. The register 14 transmits the address to the row decoder 17 and the sense amplifier 18, and transmits the command to the sequencer 15. In addition, the register 14 retains various tables for controlling a sequence which is performed based on the command.

The sequencer 15 receives the command and refers to various tables of the register 14. In addition, the sequencer 15 controls entirety of the semiconductor device 100 according to information shown in the various tables.

The voltage generation circuit 16 generates voltages necessary for operations, such as writing of data, reading of the data, and erasing of the data, according to the control of the sequencer 15. The voltage generation circuit 16 supplies the row decoder 17 and the sense amplifier 18 with the generated voltages. The voltage generation circuit 16 includes a substrate bias generation circuit 16A. The substrate bias generation circuit 16A generates a substrate bias of a MOS transistor. The substrate bias generation circuit 16A will be described in detail with reference to FIG. 3 below.

The row decoder 17 receives a row address from the register 14, and selects the word line WL in the memory cell array 10 based on the row address. In addition, the row decoder 17 supplies the selected word line WL with a voltage from the voltage generation circuit 16.

The sense amplifier 18 reads data of the memory cells MC through the bit lines BL in the memory cell array 10, or writes the data into the memory cells MC in the memory cell array 10 through the bit lines BL. The sense amplifier 18 includes a data latch (not illustrated), and the data latch temporarily stores the write data and the read data. The sense amplifier 18 receives a column address from the register 14, and outputs the data of the data latch to the input and output circuit 11 based on the column address.

Figure 3:
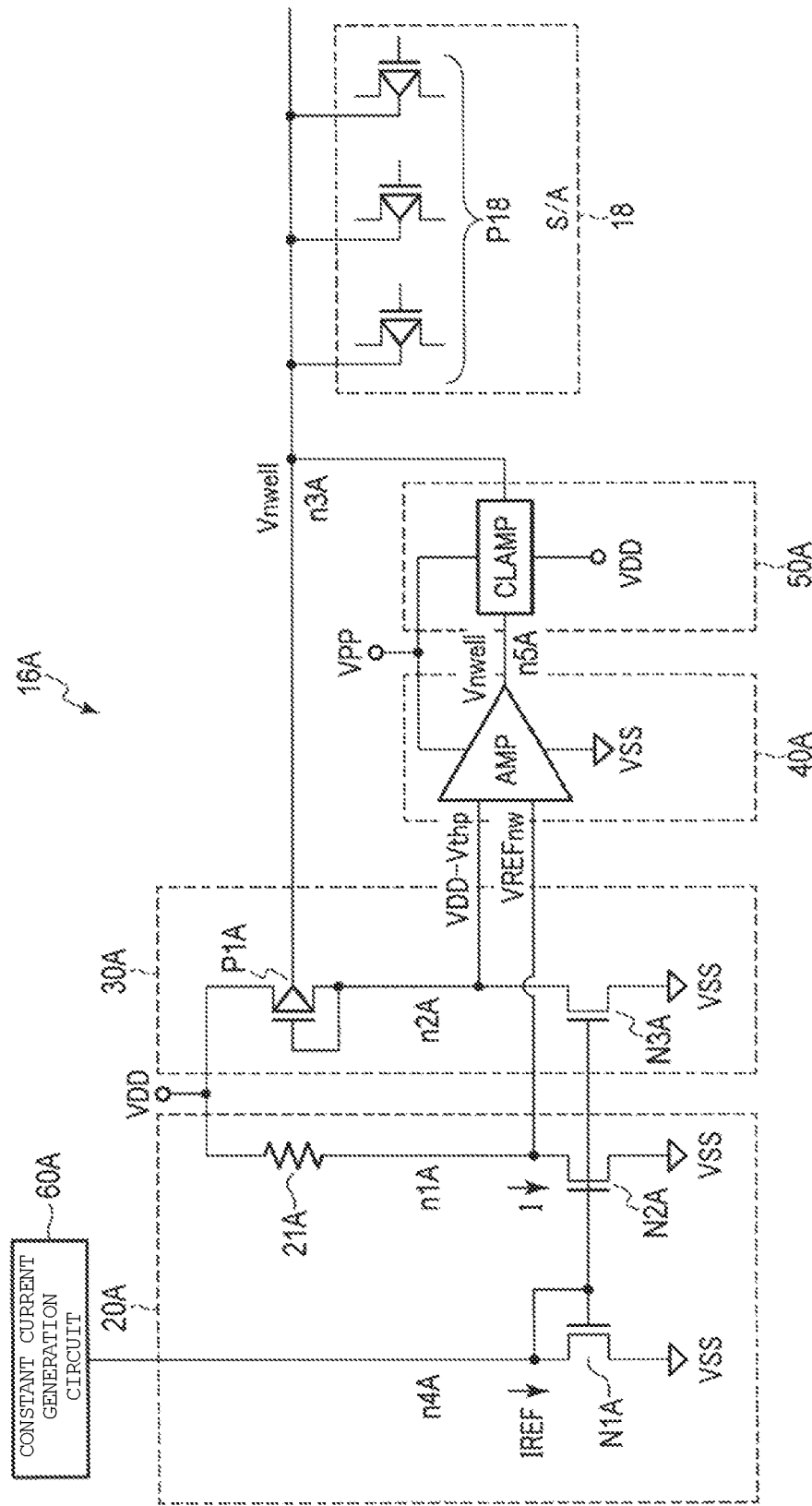
FIG. 3 is a diagram illustrating a substrate bias generation circuit of the semiconductor device according to the first embodiment.

FIG. 3 is a diagram illustrating the substrate bias generation circuit 16A of the semiconductor device 100 according to the first embodiment.

As illustrated in FIG. 3, the substrate bias generation circuit 16A includes a reference voltage generation circuit 20A, a monitoring voltage generation circuit 30A, an amplification circuit 40A, and a clamp circuit 50A.

The reference voltage generation circuit 20A includes NMOS transistors N1A and N2A, and a resistor 21A. One terminal of the NMOS transistor N1A is electrically connected to a node n4A. The one terminal and a gate of the NMOS transistor N1A are diode-connected. A ground voltage VSS (for example, 0 V) is supplied to the other terminal of the NMOS transistor N1A. A power supply voltage VDD is supplied to one terminal of the resistor 21A, and the other terminal thereof is electrically connected to a node n1A. One terminal of the NMOS transistor N2A is electrically connected to the node n1A, and the ground voltage VSS is supplied to the other terminal of the NMOS transistor N2A. A gate of the NMOS transistor N2A is electrically connected to the gate of the NMOS transistor N1A. A current mirror circuit is formed by the NMOS transistors N1A and N2A.

The monitoring voltage generation circuit 30A includes an NMOS transistor N3A and a PMOS transistor P1A. The power supply voltage VDD is supplied to one terminal of the PMOS transistor P1A. The other terminal and a gate of the PMOS transistor P1A are diode-connected, and are electrically connected to a node n2A. A well (or also referred to as a back gate) of the PMOS transistor P1A is electrically connected to a node n3A. One terminal of the NMOS transistor N3A is electrically connected to the node n2A, and the ground voltage VSS is supplied to the other terminal of the NMOS transistor N3A. A gate of the NMOS transistor N3A is electrically connected to the gate of the NMOS transistor N1A.

A first input terminal of the amplification circuit 40A is electrically connected to the node n1A, and a second input terminal of the amplification circuit 40A is electrically connected to the node n2A. An output terminal of the amplification circuit 40A is electrically connected to an input terminal of the clamp circuit 50A. An output terminal of the clamp circuit 50A is electrically connected to the node n3A. The node n3A is electrically connected to a substrate of the PMOS transistor P1A of the monitoring voltage generation circuit 30A. In addition, the node n3A is electrically connected to a substrate of PMOS transistors P18 of the sense amplifier 18 or the like. Configurations of the amplification circuit 40A and the clamp circuit 50A will be described below.

Figure 4:
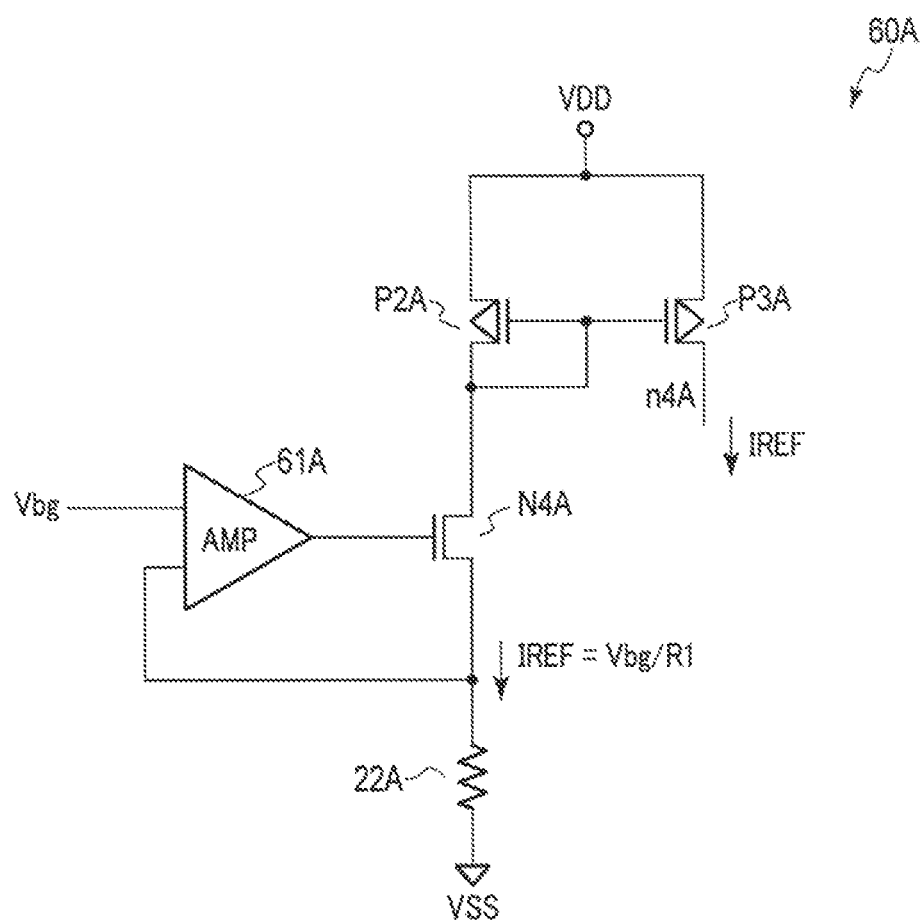
FIG. 4 is a diagram illustrating a constant current generation circuit of the semiconductor device according to the first embodiment.

FIG. 4 is a diagram illustrating a constant current generation circuit 60A of the semiconductor device 100 according to the first embodiment. The constant current generation circuit 60A supplies the reference voltage generation circuit 20A with a constant current IREF.

As illustrated in FIG. 4, the constant current generation circuit 60A includes an amplification circuit 61A, an NMOS transistor N4A, PMOS transistors P2A and P3A, and a resistor 22A.

A first input terminal of the amplification circuit 61A receives a constant voltage (bandgap reference voltage) Vbg, and a second input terminal of the amplification circuit 61A is electrically connected to one terminal of the NMOS transistor N4A. An output terminal of the amplification circuit 61A is electrically connected to a gate of the NMOS transistor N4A. The power supply voltage VDD is supplied to one terminal of the PMOS transistor P2A. The other terminal and a gate of the PMOS transistor P2A are diode-connected, and are electrically connected to the other terminal of the NMOS transistor N4A. One terminal of the resistor 22A is electrically connected to one terminal of the NMOS transistor N4A, and the ground voltage VSS is supplied to the other terminal of the resistor 22A. The power supply voltage VDD is supplied to one terminal of the PMOS transistor P3A. A gate of the PMOS transistor P3A is electrically connected to the gate of the PMOS transistor P2A. A current mirror circuit is formed by the PMOS transistors P2A and P3A. The other terminal of the PMOS transistor P3A is electrically connected to the node n4A.

Figure 5:
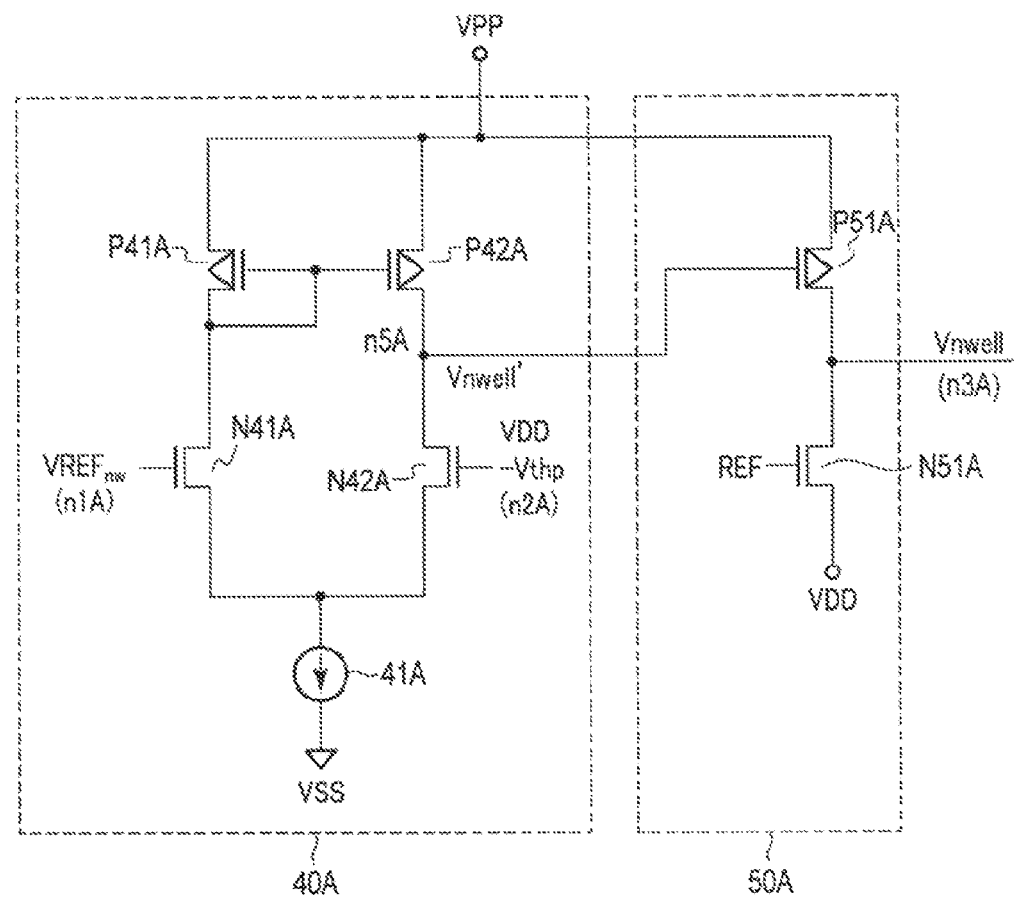
FIG. 5 is a diagram illustrating an amplification circuit and a clamp circuit in the semiconductor device according to the first embodiment.

FIG. 5 is a diagram illustrating the amplification circuit 40A and the clamp circuit 50A in the semiconductor device 100 according to the first embodiment.

As illustrated in FIG. 5, the amplification circuit 40A includes NMOS transistors N41A and N42A, PMOS transistors P41A and P42A, and a constant current source 41A.

A voltage VPP(>VDD) is supplied to one terminal of the PMOS transistor P41A, and the other terminal of the PMOS transistor P41A is electrically connected to one terminal of the NMOS transistor N41A. In addition, the other terminal and a gate of the PMOS transistor P41A are diode-connected. The other terminal of the NMOS transistor N41A is electrically connected to an input terminal of the constant current source 41A. A gate of the NMOS transistor N41A is a first input terminal of the amplification circuit 40A, and is electrically connected to the node n1A. An output terminal of the constant current source 41A is electrically connected to a ground potential (ground voltage VSS).

The voltage VPP is supplied to one terminal of the PMOS transistor P42A, and the other terminal of the PMOS transistor P42A is electrically connected to a node n5A. A gate of the PMOS transistor P42A is electrically connected to the gate of the PMOS transistor P41A. A current mirror circuit is formed by the PMOS transistors P41A and P42A. One terminal of the NMOS transistor N42A is electrically connected to the node n5A, and the other terminal of the NMOS transistor N42A is electrically connected to an input terminal of the constant current source 41A. A gate of the NMOS transistor N42A is a second input terminal of the amplification circuit 40A, and is electrically connected to the node n2A. A connection terminal between the other terminal of the PMOS transistor P42A and the one terminal of the NMOS transistor N42A is an output terminal of the amplification circuit 40A.

The clamp circuit 50A includes a PMOS transistor P51A and an NMOS transistor N51A.

The voltage VPP is supplied to one terminal of the PMOS transistor P51A, and the other terminal of the PMOS transistor P51A is electrically connected to one terminal of the NMOS transistor N51A. A gate of the PMOS transistor P51A is an input terminal of the clamp circuit 50A, and is electrically connected to an output terminal (a connection terminal between the other terminal of the PMOS transistor P42A and the other terminal of the NMOS transistor N42A) of the amplification circuit 40A. The power supply voltage VDD is supplied to the other terminal of the NMOS transistor N51A, and a signal REF is supplied to a gate of the NMOS transistor N51A. A connection terminal between the other terminal of the PMOS transistor P51A and the one terminal of the NMOS transistor N51A is an output terminal of the clamp circuit 50A and is electrically connected to the node n3A.

Operation Example of First Embodiment

Next, an operation example of the substrate bias generation circuit 16A of the semiconductor device 100 according to the first embodiment will be described.

First, an operation of the substrate bias generation circuit 16A will be described with reference to FIG. 3.

In the first embodiment, the reference voltage generation circuit 20A generates a reference voltage VREFnw (voltage VDD−IR), based on a constant current I. The monitoring voltage generation circuit 30A monitors a threshold voltage Vthp of the PMOS transistor P1A which is a replica, and generates a monitoring voltage VDD−Vthp. The amplification circuit 40A compares the reference voltage VREFnw with the monitoring voltage VDD−Vthp, and generates a well voltage Vnwell' such that reference voltage VREFnw is equal to the monitoring voltage VDD−Vthp, based on the comparison result. A substrate bias of the PMOS transistors P1A and P18 is adjusted by the well voltage Vnwell' (or well voltage Vnwell), and threshold voltages thereof are constant regardless of temperature. Hereinafter, description thereon will be made more specifically.

As illustrated in FIG. 3, the constant current IREF which is generated by the constant current generation circuit 60A flows through the node n4A of the reference voltage generation circuit 20A. The NMOS transistors N1A and N2A form a current mirror circuit. Accordingly, the constant current I based on the constant current IREF flows through a path including the resistor 21A and the NMOS transistor N2A. Hence, a voltage VDD−IR which drops by a voltage I×R (hereinafter, referred to as IR (R is a resistance value of the resistor 21A)) from the power supply voltage VDD is applied to the node n1A. The voltage VDD−IR becomes the reference voltage VREFnw.

Meanwhile, the NMOS transistors N1A and N3A form a current mirror circuit. Accordingly, the constant current based on the constant current IREF flows through a path including the PMOS transistor P1A and the NMOS transistor N3A. In addition, the PMOS transistor P1A is diode-connected. Accordingly, the monitoring voltage VDD−Vthp which drops by the threshold voltage Vthp of the PMOS transistor P1A from the power supply voltage VDD is applied to the node n2A.

If a large current flows through the path including the PMOS transistor P1A and the NMOS transistor N3A, a voltage which is dropped by the PMOS transistor P1A from the power supply voltage VDD is higher than the threshold voltage Vthp. In contrast to this, by providing the NMOS transistor N3A, the current flowing through the path can be maintained to be constant. As a result, the monitoring voltage which drops by the threshold voltage Vthp from the power supply voltage VDD is obtained.

The reference voltage VREFnw (voltage VDD−IR) is supplied to the first input terminal of the amplification circuit 40A, and the monitoring voltage VDD−Vthp is supplied to the second input terminal of the amplification circuit 40A. The amplification circuit 40A adjusts the substrate bias of the PMOS transistor P1A, such that the voltage VDD−IR is equal to the monitoring voltage VDD−Vthp, that is, such that the threshold voltage Vthp is equal to the voltage IR. More specifically, the amplification circuit 40A generates the voltage Vnwell', and feeds back the voltage Vnwell' to a substrate of the PMOS transistor P1A through the clamp circuit 50A. At this time, the amplification circuit 40A adjusts a substrate bias such that the threshold voltage Vthp is equal to the voltage IR without depending on the power supply voltage VDD. Thereby, even if the power supply voltage fluctuates, the amplification circuit 40A can adjust the substrate bias such that the threshold voltage Vthp is accurately corrected.

The clamp circuit 50A adjusts a voltage range of the voltage Vnwell', and generates the well voltage Vnwell. The well voltage Vnwell is supplied to the substrate of the PMOS transistor P1A. The voltage range is VDD≤Vnwell≤VPP.

As will be described below, if the PMOS transistor P1A is a silicon on insulator (SOI) MOSFET, the clamp circuit 50A is not needed. In this case, the voltage Vnwell' which is generated by the clamp circuit 50A is supplied to the substrate of the PMOS transistor P1A.

The substrate bias indicates a voltage difference between a source and a well (substrate). That is, in the first embodiment, the substrate bias is a voltage difference between the well voltage Vnwell and the power supply voltage VDD. The effects of the substrate bias are as follows: as an absolute value of the substrate bias increases, a threshold voltage increases, and as the absolute value of the substrate bias decreases, the threshold voltage decreases.

Because the well voltage Vnwell is applied to the substrate of the PMOS transistor P1A, the threshold voltage Vthp of the PMOS transistor P1A is equal to the voltage IR. That is, the threshold voltage Vthp of the PMOS transistor P1A is constant regardless of temperature. As such, the generated well voltage Vnwell is applied to the substrate of the PMOS transistor P18 in the sense amplifier 18 or the like. Accordingly, the threshold voltage of the PMOS transistor P18 is constant regardless of temperature.

Next, operations of the amplification circuit 40A and the clamp circuit 50A will be described more specifically with reference to FIG. 5.

The amplification circuit 40A and the clamp circuit 50A adjust the threshold voltage Vthp such that the monitoring voltage VDD−Vthp is equal to the reference voltage VREFnw.

More specifically, as illustrated in FIG. 5, if the monitoring voltage VDD−Vthp is lower than the reference voltage VREFnw, the NMOS transistor N42A is turned on by a small degree. Accordingly, charging from the voltage VPP through the PMOS transistor P42A is greater than discharging to the ground voltage VSS through the NMOS transistor N42A, and the voltage Vnwell' of the node n5A increases. If so, the PMOS transistor P51A is turned on by a small degree. Accordingly, discharging to the power supply voltage VDD (<VPP) through the NMOS transistor N51A is greater than charging from the voltage VPP through the PMOS transistor P51A, and the well voltage Vnwell of the node n3A is decreased. That is, the substrate bias decreases, and the threshold voltage Vthp decreases. Hence, the monitoring voltage VDD−Vthp increases so as to be equal to the reference voltage VREFnw.

Meanwhile, if the monitoring voltage VDD−Vthp is higher than the reference voltage VREFnw, an operation opposite to the aforementioned operation is performed. That is, the well voltage Vnwell is adjusted to increase (such that the substrate bias increase), and the threshold voltage Vthp increases. Hence, the monitoring voltage VDD−Vthp decreases so as to be equal to the reference voltage VREFnw.

Next, an operation of the constant current generation circuit 60A will be described with reference to FIG. 4.

As illustrated in FIG. 4, the amplification circuit 61A compares a constant voltage Vbg with a voltage of the one terminal of the resistor 22A, and outputs the comparison result to the gate of the NMOS transistor N4A. Thereby, the constant current IREF flows through the path including the PMOS transistor P2A, the NMOS transistor N4A, and the resistor 22A. The constant current IREF is represented by Vbg/R1 (R1 is a resistance value of the resistor 22A). That is, the constant current IREF depends on the resistance value of the resistor 22A, and reflects variation due to temperature characteristics of the resistor 22A. The PMOS transistors P2A and P3A form a current mirror circuit. Thereby, the constant current IREF is supplied to the node n4A (reference voltage generation circuit 20A).

As illustrated in FIG. 3, the constant current I flows through the resistor 21A of the reference voltage generation circuit 20A. The constant current I is based on the constant current IREF to which variation due to the temperature characteristics of the resistor 22A is reflected. In addition, temperature characteristics of the resistor 21A are substantially the same as the temperature characteristics of the resistor 22A. Hence, although a resistance value R of the resistor 21A varies due to the temperature characteristics, the temperature characteristics are reflected in the constant current I, and thus, the voltage IR is maintained to be constant.

Configuration of PMOS Transistor According to First Embodiment

Next, a configuration of the PMOS transistor P1A (and P18) in the semiconductor device 100 according to the first embodiment will be described.

Figure 6:
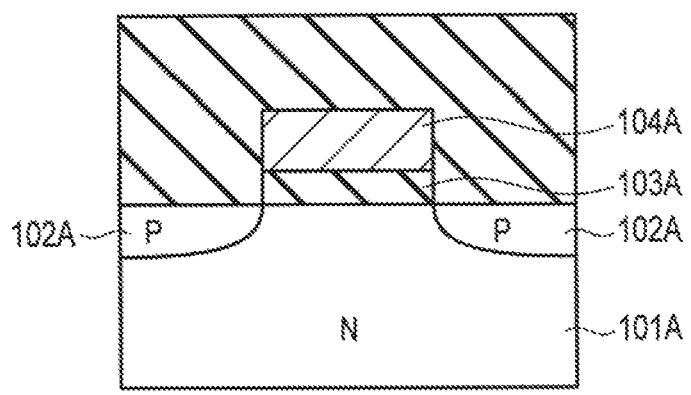
FIG. 6 is a sectional diagram illustrating a first example of a PMOS transistor of the semiconductor device according to the first embodiment.
Figure 7:
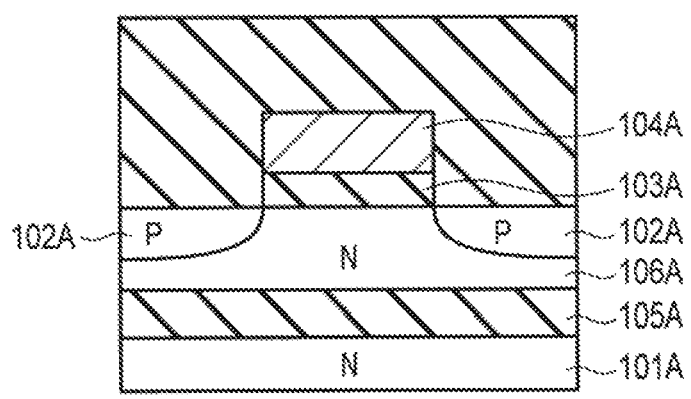
FIG. 7 is a sectional diagram illustrating a second example of the PMOS transistor of the semiconductor device according to the first embodiment.

FIG. 6 is a sectional diagram illustrating a first example of the PMOS transistor P1A in the semiconductor device 100 according to the first embodiment. FIG. 7 is a sectional diagram illustrating a second example of the PMOS transistor P1A in the semiconductor device 100 according to the first embodiment.

As illustrated in FIG. 6, the PMOS transistor P1A according to the first example has a bulk MOSFET structure. More specifically, the PMOS transistor P1A includes an N-type substrate (N-type well) 101A, P-type source drain diffusion layers 102A, a gate insulation layer 103A, and a gate electrode 104A. The P-type source drain diffusion layer 102A is provided on a surface of the N-type substrate (N-type well) 101A. The gate insulation layer 103A is provided on the N-type substrate 101A, and interposed between the P-type source drain diffusion layers 102A. The gate electrode 104A is provided on the gate insulation layer 103A.

As described in the first example, if the PMOS transistor P1A has the bulk MOSFET structure and the power supply voltage VDD is applied to the P-type source 102A, and if the well voltage Vnwell lower than the power supply voltage VDD is applied to the N-type well 101A, a PN junction is forward-biased. That is, a large current flows through the N-type well 101A from the P-type source 102A. In the first embodiment, the clamp circuit 50A is provided to prevent the PN junction from being forward-biased. The clamp circuit 50A adjusts the well voltage Vnwell so as to be equal to or higher than VDD and equal to or lower than VPP. Thereby, the well voltage Vnwell is equal to or higher than a source voltage (VDD), and it is possible to prevent the PN junction from being forward-biased.

As illustrated in FIG. 7, the PMOS transistor P1A according to the second example has a SOIMOSFET structure. That is, the PMOS transistor P1A includes an oxide film 105A, differently from the first example. The oxide film 105A is provided between the N-type substrate 101A and the P-type source drain diffusion layers 102A. In addition, an N-type semiconductor layer 106A is provided on the oxide film 105A, and the P-type source drain diffusion layers 102A are provided on a surface of the oxide film 105A.

As described in the second example, if the PMOS transistor P1A has the SOIMOSFET structure, the oxide film 105A is provided between the N-type substrate 101A and the P-type source drain diffusion layers 102A. That is, the P-type source 102A is not in contact with the N-type well 101A. Accordingly, although the power supply voltage VDD is applied to the P-type source 102A and the well voltage Vnwell lower than the power supply voltage VDD is applied to the N-type well 101A, the forward bias of the PN junction does not become a problem. Hence, the clamp circuit 50A need not be provided in the structure of the second example.

Effects of First Embodiment

Figure 8:
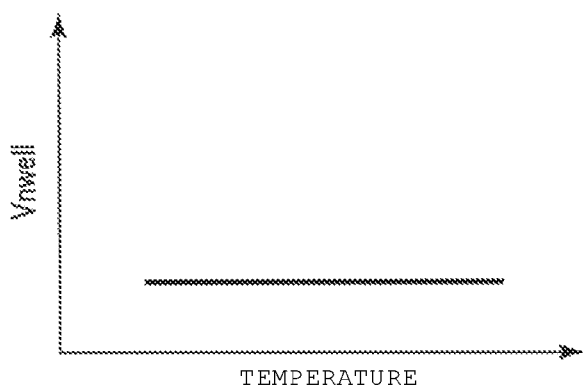
FIG. 8 is a diagram illustrating a relationship between a well voltage of a PMOS transistor of a semiconductor device according to a comparative example, and temperature.
Figure 9:
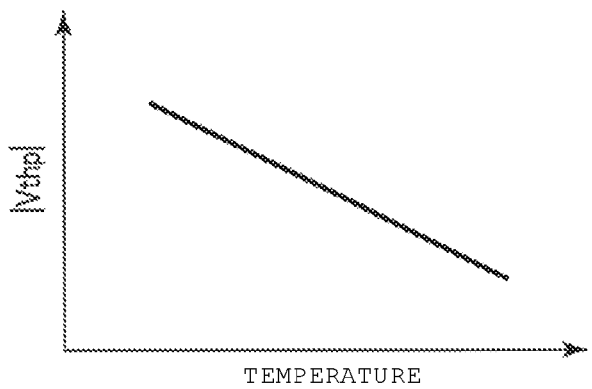
FIG. 9 is a diagram illustrating a relationship between a threshold voltage of the PMOS transistor of the semiconductor device according to the comparative example, and temperature.

FIG. 8 is a diagram illustrating a relationship between the well voltage of the PMOS transistor of the semiconductor device according to a comparative example, and temperature. FIG. 9 is a diagram illustrating a relationship between the threshold voltage of the PMOS transistor of the semiconductor device according to the comparative example, and temperature. In addition, FIG. 10 is a diagram illustrating a relationship between a well voltage of the PMOS transistor P1A (and P18) of the semiconductor device 100 according to the first embodiment, and temperature, and FIG. 11 is a diagram illustrating a relationship between the threshold voltage of the PMOS transistor P1A (and P18) of the semiconductor device 100 according to the first embodiment, and temperature.

In the comparative example, as illustrated in FIG. 8, the well voltage Vnwell of the PMOS transistor is constant regardless of the temperature. That is, the substrate bias of the PMOS transistor is not adjusted. Meanwhile, the threshold voltage Vthp of the PMOS transistor has temperature characteristics. Accordingly, if the substrate bias of the PMOS transistor is not adjusted, the threshold voltage Vthp of the PMOS transistor varies due to variation of the temperature, as illustrated in FIG. 9. More specifically, if the temperature is high, an absolute value of the threshold voltage Vthp of the PMOS transistor decreases, and if the temperature is low, the absolute value of the threshold voltage Vthp of the PMOS transistor increases.

In contrast to this, according to the first embodiment, the substrate bias generation circuit 16A monitors variation due to the temperature characteristics of the threshold voltage Vthp of the PMOS transistor P1A which is a replica. In addition, the substrate bias generation circuit 16A adjusts the substrate bias of the PMOS transistor P1A such that the variation due to the temperature characteristics of the threshold voltage Vthp is corrected.

Figure 10:
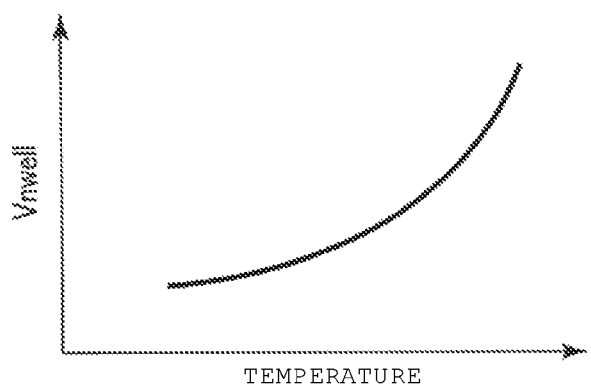
FIG. 10 is a diagram illustrating a relationship between a well voltage of the PMOS transistor of the semiconductor device according to the first embodiment, and temperature.
Figure 11:
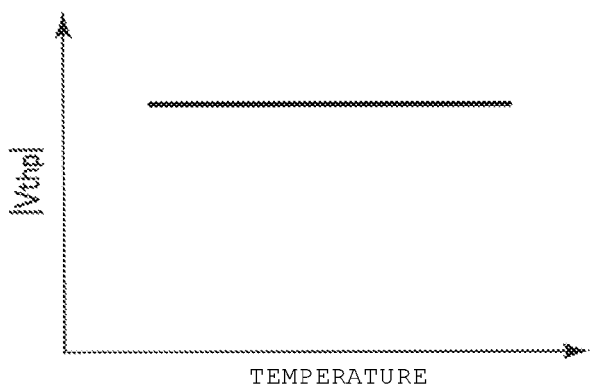
FIG. 11 is a diagram illustrating a relationship between a threshold voltage of the PMOS transistor of the semiconductor device according to the first embodiment, and temperature.

More specifically, as illustrated in FIG. 10, the substrate bias generation circuit 16A increases the well voltage Vnwell of the PMOS transistor P1A, if the temperature is high, and decreases the well voltage Vnwell of the PMOS transistor P1A, if the temperature is low. That is, if the temperature is high, the absolute value of the substrate bias increases, and if the temperature is low, the absolute value of the substrate bias decreases. Accordingly, the substrate bias generation circuit 16A can maintain the threshold voltage Vthp of the PMOS transistor P1A to be constant, regardless of the temperature, by adjusting the well voltage Vnwell, as illustrated in FIG. 11. In addition, the substrate bias generation circuit 16A supplies the adjusted substrate bias to the PMOS transistors P18 of the sense amplifier 18 or the like. Thereby, it is possible to maintain the threshold voltages of the PMOS transistors P18 to be constant, and to increase performance and reliability of products.

In addition, according to the first embodiment, the constant current generation circuit 60A includes the resistor 22A and generates the constant current IREF. The constant current IREF depends on the resistance value of the resistor 22A, and reflects variation due to the temperature characteristics of the resistor 22A. Meanwhile, the constant current I flows through the resistor 21A of the reference voltage generation circuit 20A. The constant current I is based on the constant current IREF to which variation due to the temperature characteristics of the resistor 22A is reflected. In addition, the temperature characteristics of the resistor 21A is substantially the same as the temperature characteristics of the resistor 22A. Hence, although the resistance value R of the resistor 21A varies due to the temperature characteristics, the temperature characteristics are reflected to the constant current I, the voltage IR is maintained to be constant.

The temperature is measured by a temperature measurement instrument provided in a chip, and corresponds to an external temperature.

Second Embodiment

A semiconductor device according to a second embodiment will be hereinafter described with reference to FIG. 12 to FIG. 16. In the first embodiment, the substrate bias generation circuit 16A adjusts the substrate bias of the PMOS transistor thereby maintaining the threshold voltage of the PMOS transistor to be constant. In contrast to this, in the second embodiment, a substrate bias generation circuit 16B adjusts a substrate bias of an NMOS transistor, and thereby, a threshold voltage of the NMOS transistor is maintained to be constant. In the second embodiment, description on the same points as in the first embodiment will be omitted, and different points from the first embodiment will be mainly described.

Configuration Example of Second Embodiment

First, a configuration example of a semiconductor device 100 according to the second embodiment will be described.

Figure 12:
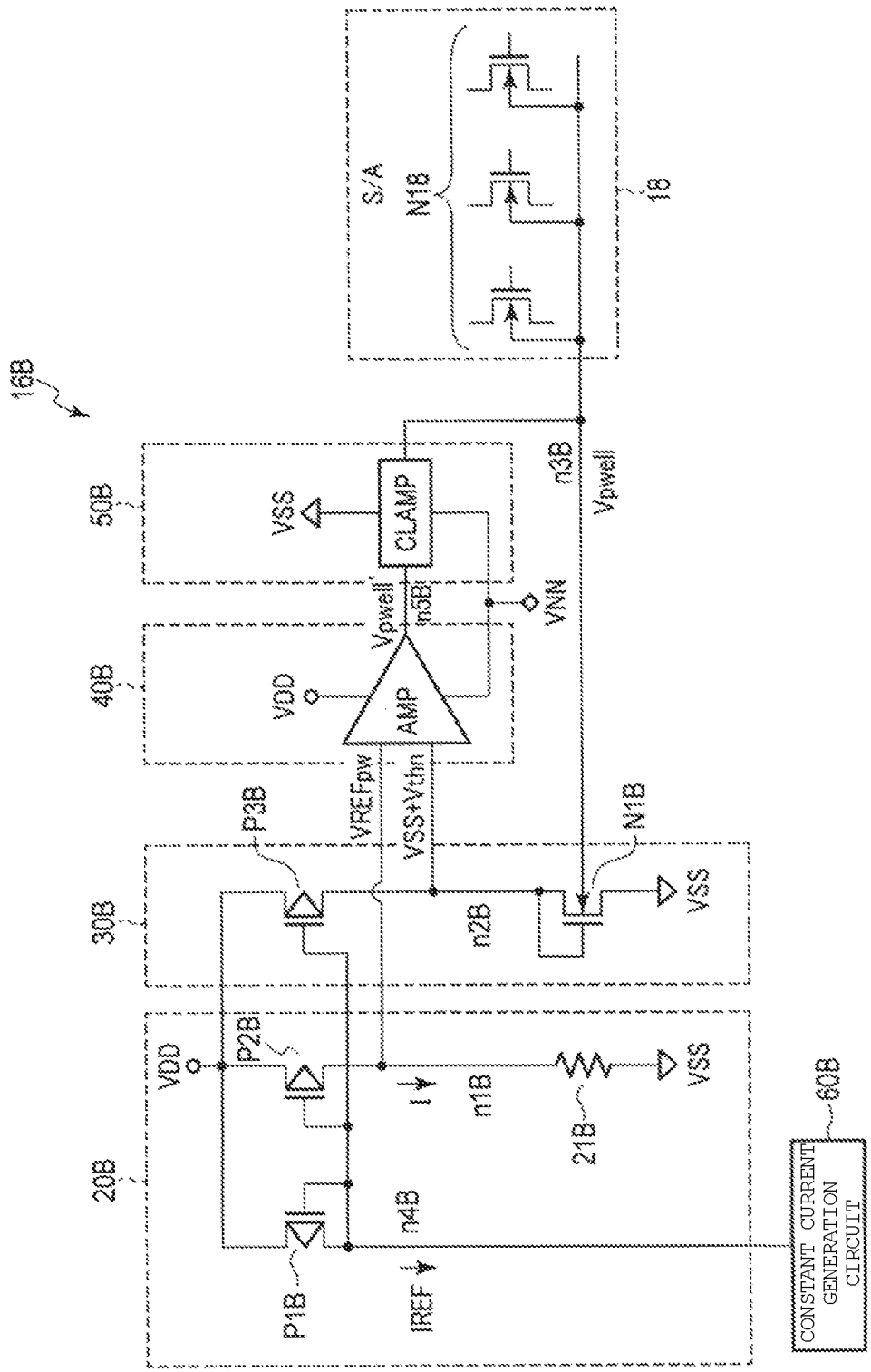
FIG. 12 is a diagram illustrating a substrate bias generation circuit of a semiconductor device according to a second embodiment.

FIG. 12 is a diagram illustrating the substrate bias generation circuit 16B of the semiconductor device 100 according to the second embodiment.

As illustrated in FIG. 12, the substrate bias generation circuit 16B includes a reference voltage generation circuit 20B, a monitoring voltage generation circuit 30B, an amplification circuit 40B, and a clamp circuit 50B.

The reference voltage generation circuit 20B includes PMOS transistors P1B and P2B, and a resistor 21B. The power supply voltage VDD is supplied to one terminal of the PMOS transistor P1B, and the other terminal of the PMOS transistor P1B is electrically connected to a node n4B. The other terminal and a gate of the PMOS transistor P1B are diode-connected. The power supply voltage VDD is supplied to one terminal of the PMOS transistor P2B, and the other terminal of the PMOS transistor P2B is electrically connected to a node n1B. A gate of the PMOS transistor P2B is electrically connected to a gate of the PMOS transistor P1B. A current mirror circuit is formed by the PMOS transistors P1B and P2B. One terminal of the resistor 21B is electrically connected to the node n1B, and the ground voltage VSS is supplied to the other terminal of the resistor 21B.

The monitoring voltage generation circuit 30B includes a PMOS transistor P3B and an NMOS transistor N1B. A power supply voltage is supplied to one terminal of the PMOS transistor P3B, and the other terminal thereof is electrically connected to the node n2B. A gate of the PMOS transistor P3B is electrically connected to the gate of the PMOS transistor P1B. One terminal and a gate of the NMOS transistor N1B are diode-connected, and are electrically connected to a node n2B. The ground voltage VSS is supplied to the other terminal of the NMOS transistor N1B.

A first input terminal of the amplification circuit 40B is electrically connected to the node n1B, and a second input terminal of the amplification circuit 40B is electrically connected to the node n2B. An output terminal of the amplification circuit 40B is electrically connected to an input terminal of the clamp circuit 50B. An output terminal of the clamp circuit 50B is electrically connected to a node n3B. The node n3B is electrically connected to a substrate of the NMOS transistor N1B of the monitoring voltage generation circuit 30B. In addition, the node n3B is electrically connected to a substrate of NMOS transistor N18 of the sense amplifier 18 or the like.

Figure 13:
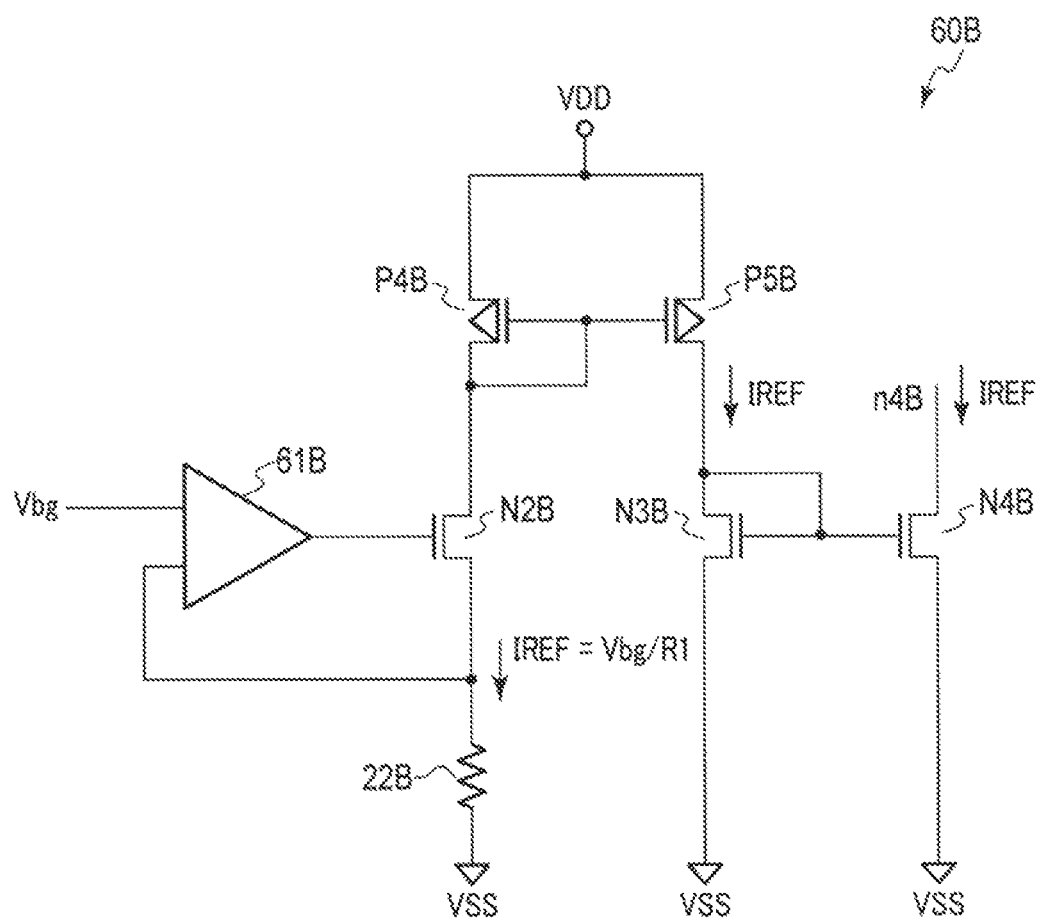
FIG. 13 is a diagram illustrating a constant current generation circuit of the semiconductor device according to the second embodiment.

FIG. 13 is a diagram illustrating a constant current generation circuit 60B of the semiconductor device 100 according to the second embodiment. The constant current generation circuit 60B supplies the constant current IREF to the reference voltage generation circuit 20B.

As illustrated in FIG. 13, the constant current generation circuit 60B includes an amplification circuit 61B, NMOS transistors N2B, N3B, and N4B, PMOS transistors P4B and P5B, and a resistor 22B.

The constant voltage Vbg is supplied to a first input terminal of the amplification circuit 61B, and a second input terminal of the amplification circuit 61B is electrically connected to one terminal of the NMOS transistor N2B. An output terminal of the amplification circuit 61B is electrically connected to a gate of the NMOS transistor N2B. The power supply voltage VDD is supplied to one terminal of the PMOS transistor P4B. The other terminal and a gate of the PMOS transistor P4B are diode-connected, and are electrically connected to the other terminal of the NMOS transistor N2B. One terminal of the resistor 22B is electrically connected to the one terminal of the NMOS transistor N2B, and the ground voltage VSS is supplied to the other terminal of the resistor 22B.

The power supply voltage VDD is supplied to one terminal of the PMOS transistor P5B. A gate of the PMOS transistor P5B is electrically connected to a gate of the PMOS transistor P4B. A current mirror circuit is formed by the PMOS transistors P4B and P5B. The other terminal of the PMOS transistor P5B is electrically connected to one terminal of the NMOS transistor N3B. The ground voltage VSS is supplied to the other terminal of the NMOS transistor N3B. The one terminal and a gate of the NMOS transistor N3B are diode-connected.

One terminal of the NMOS transistor N4B is electrically connected to the node n4B, and the ground voltage VSS is supplied to the other terminal of the NMOS transistor N4B. A gate of the NMOS transistor N4B is electrically connected to the gate of the NMOS transistor N3B. A current mirror circuit is formed by the NMOS transistors N3B and N4B.

Figure 14:
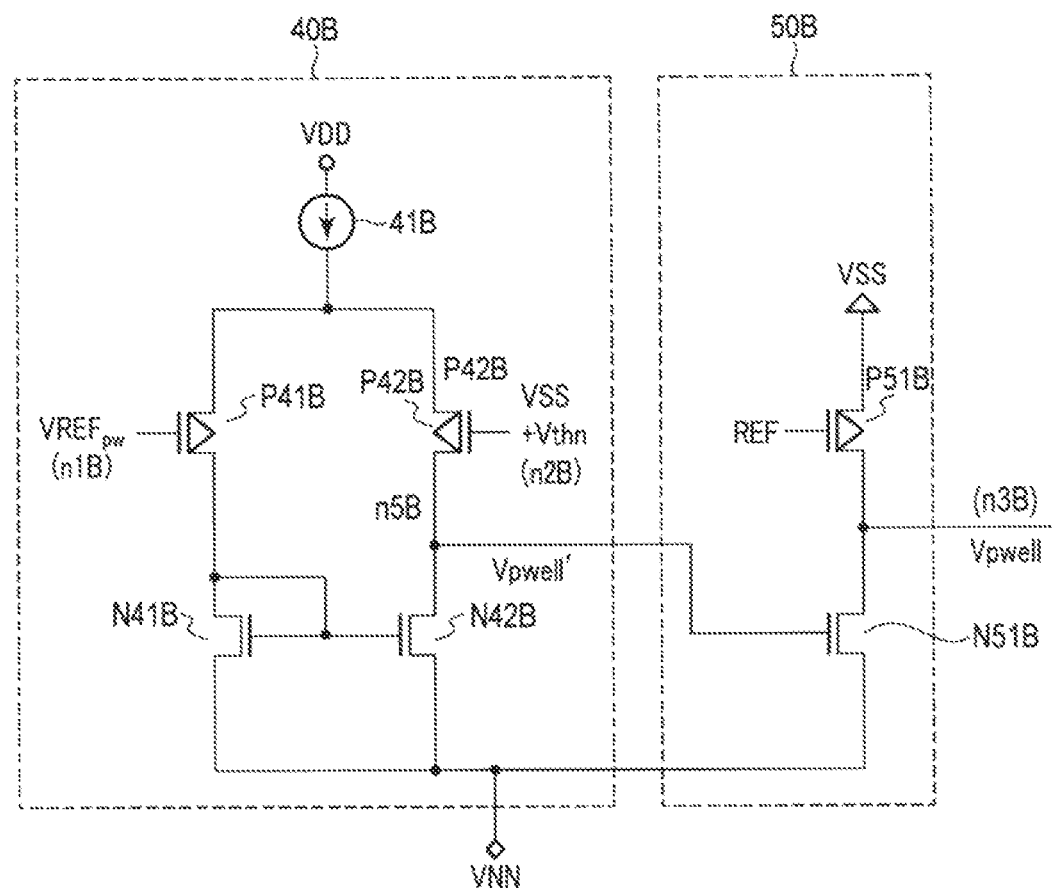
FIG. 14 is a diagram illustrating an amplification circuit and a clamp circuit of the semiconductor device according to the second embodiment.

FIG. 14 is a diagram illustrating the amplification circuit 40B and the clamp circuit 50B of the semiconductor device 100 according to the second embodiment.

As illustrated in FIG. 14, the amplification circuit 40B includes NMOS transistors N41B and N42B, PMOS transistors P41B and P42B, and a constant current source 41B.

The power supply voltage VDD is supplied to an input terminal of the constant current source 41B. One terminal of the PMOS transistor P41B is electrically connected to an output terminal of the constant current source 41B, and the other terminal of the PMOS transistor P41B is electrically connected to one terminal of the NMOS transistor N41B. A gate of the PMOS transistor P41B is a first input terminal of the amplification circuit 40B, and is electrically connected to the node n1B. The one terminal and a gate of the NMOS transistor N41B are diode-connected. A voltage VNN (<VSS) is supplied to the other terminal of the NMOS transistor N41B.

One terminal of the PMOS transistor P42B is electrically connected to the output terminal of the constant current source 41B, and the other terminal of the PMOS transistor P42B is electrically connected to a node n5B. A gate of the PMOS transistor P42B is a second input terminal of the amplification circuit 40B, and is electrically connected to the node n2B. One terminal of the NMOS transistor N42B is electrically connected to the node n5B, and the voltage VNN is supplied to the other terminal of the NMOS transistor N42B. A gate of the NMOS transistor N42B is electrically connected to the gate of the NMOS transistor N41B. A current mirror circuit is formed by the NMOS transistors N41B and N42B. A connection terminal (node n5B) between the other terminal of PMOS transistor P42B and the one terminal of the NMOS transistor N42B is the output terminal of the amplification circuit 40B.

The clamp circuit 50B includes a PMOS transistor P51B and an NMOS transistor N51B.

The ground voltage VSS is supplied to one terminal of the PMOS transistor P51B, and the other terminal of the PMOS transistor P51B is electrically connected to one terminal of the NMOS transistor N51B. The voltage VNN is supplied to the other terminal of the NMOS transistor N51B. A gate of the NMOS transistor N51B is an input terminal of the clamp circuit 50B, and is electrically connected to an output terminal (a connection terminal between the other terminal of the PMOS transistor P42B and the one terminal of the NMOS transistor N42B) of the amplification circuit 40B. A connection terminal between the other terminal of the PMOS transistor P51B and the one terminal of the NMOS transistor N51B is an output terminal of the clamp circuit 50B, and is electrically connected to the node n3B.

Operation Example of Second Embodiment

Next, an operation example of the substrate bias generation circuit 16B of the semiconductor device 100 according to the second embodiment will be described.

First, an operation of the substrate bias generation circuit 16B will be described with reference to FIG. 12.

In the second embodiment, the reference voltage generation circuit 20B generates a reference voltage VREFpw (voltage VSS+IR), based on the constant current I. The monitoring voltage generation circuit 30B monitors a threshold voltage Vthn of the NMOS transistor N1B which is a replica, and generates a monitoring voltage VSS+Vthn. The amplification circuit 40B compares the reference voltage VREFpw with the monitoring voltage VSS+Vthn, and generates a well voltage Vpwell' such that reference voltage VREFpw is equal to the monitoring voltage VSS+Vthn, based on the comparison result. A substrate bias of the NMOS transistors N1B and N18 is adjusted by the well voltage Vpwell' (or well voltage Vpwell), and threshold voltages thereof are constant regardless of temperature. Hereinafter, description thereon will be made more specifically.

As illustrated in FIG. 12, the constant current IREF which is generated by the constant current generation circuit 60B flows through the node n4B of the reference voltage generation circuit 20B. The PMOS transistors P1B and P2B form a current mirror circuit. Accordingly, the constant current I based on the constant current IREF flows through a path including the resistor 21B and the PMOS transistor P2B. Hence, a voltage VSS+IR which increases by a voltage IR (R is a resistance value of the resistor 21B) from the ground voltage VSS is applied to the node n1B. The voltage VSS+IR becomes the reference voltage VREFpw.

Meanwhile, the PMOS transistors P1B and P3B form a current mirror circuit. Accordingly, the constant current based on the constant current IREF flows through a path including the PMOS transistor P3B and the NMOS transistor N1B. In addition, the NMOS transistor N1B is diode-connected. Accordingly, the monitoring voltage VSS+Vthn which increases by the threshold voltage Vthn of the NMOS transistor N1B from the ground voltage VSS is applied to the node n2B.

If a large current flows through the path including the PMOS transistor P3B and the NMOS transistor N1B, a voltage which is increased by the NMOS transistor N1B from the ground voltage VSS is higher than the threshold voltage Vthn. In contrast to this, by providing the PMOS transistor P3B, the current flowing through the path can be maintained to be constant. As a result, the monitoring voltage which increases by the threshold voltage Vthn from the ground voltage VSS is obtained.

The reference voltage VREFpw (voltage VSS+IR) is supplied to the first input terminal of the amplification circuit 40B, and the voltage VSS+Vthn is supplied to the second input terminal of the amplification circuit 40B. The amplification circuit 40B adjusts the substrate bias of the NMOS transistor N1B, such that the voltage VSS+IR is equal to the monitoring voltage VSS+Vthn, that is, such that the threshold voltage Vthn is equal to the voltage IR. More specifically, the amplification circuit 40B generates the voltage Vpwell', and feeds back the voltage Vpwell' to a substrate of the NMOS transistor N1B through the clamp circuit 50B.

The clamp circuit 50B adjusts a voltage range of the voltage Vpwell', and generates the well voltage Vpwell. The well voltage Vpwell is supplied to the substrate of the NMOS transistor N1B. The voltage range is VNN≤Vpwell≤VSS.

As will be described below, if the NMOS transistor N1B is a SOIMOSFET, the clamp circuit 50B is not needed. In this case, the voltage Vpwell' which is generated by the clamp circuit 50B is supplied to the substrate of the NMOS transistor N1B.

In the second embodiment, the substrate bias is a voltage difference between the well voltage Vpwell and the ground voltage VSS.

Because the well voltage Vpwell is applied to the substrate of the NMOS transistor N1B, the threshold voltage Vthn of the NMOS transistor N1B is equal to the voltage IR. That is, the threshold voltage Vthn of the NMOS transistor N1B is constant regardless of temperature. As such, the generated well voltage Vpwell is applied to the substrate of the NMOS transistor N18 in the sense amplifier 18 or the like. Accordingly, the threshold voltage of the NMOS transistor N18 is constant regardless of temperature.

Next, operations of the amplification circuit 40B and the clamp circuit 50B will be described more specifically with reference to FIG. 14.

The amplification circuit 40B and the clamp circuit 50B adjust the threshold voltage Vthn such that the monitoring voltage VSS+Vthn is equal to the reference voltage VREFpw.

More specifically, as illustrated in FIG. 14, if the monitoring voltage VSS+Vthn is lower than the reference voltage VREFpw, the PMOS transistor P42B is turned on by a large degree. Accordingly, charging from the power supply voltage VDD through the PMOS transistor P42B is greater than discharging to the voltage VNN through the NMOS transistor N42B, and the voltage Vpwell' of the node n5B increases. If so, the NMOS transistor N51B is turned on by a large degree. Accordingly, discharging to the voltage VNN (<VSS) through the NMOS transistor N51B is greater than charging from the ground voltage VSS through the PMOS transistor P51B, and the well voltage Vpwell of the node n3B decreases. That is, the substrate bias increases, and the threshold voltage Vthn increases. Hence, the monitoring voltage VSS+Vthn increases so as to be equal to the reference voltage VREFpw.

Meanwhile, if the monitoring voltage VSS+Vthn is higher than the reference voltage VREFpw, an operation opposite to the aforementioned operation is performed. That is, the well voltage Vpwell increases (such that the substrate bias decreases), and the threshold voltage Vthn decreases. Hence, the monitoring voltage VSS+Vthn decreases so as to be equal to the reference voltage VREFpw.

Next, an operation of the constant current generation circuit 60B will be described with reference to FIG. 13.

As illustrated in FIG. 13, the amplification circuit 61B compares the constant voltage Vbg with a voltage of the one terminal of the resistor 22B, and outputs the comparison result to the gate of the NMOS transistor N2B. Thereby, the constant current IREF flows through the path including the PMOS transistor P4B, the NMOS transistor N2B and the resistor 22B. The constant current IREF is represented by Vbg/R1 (R1 is a resistance value of the resistor 22B). That is, the constant current IREF depends on the resistance value of the resistor 22B, and reflects variation due to temperature characteristics of the resistor 22B. The PMOS transistors P4B and P5B form a current mirror circuit. Thereby, the constant current IREF flows through the path including the PMOS transistor P5B and the NMOS transistor N3B. In addition, the NMOS transistors N3B and N4B form a current mirror circuit. Thereby, the constant current IREF is supplied to the node n4B (reference voltage generation circuit 20B).

Configuration of NMOS Transistor According to Second Embodiment

Next, a configuration of the NMOS transistor N1B (and N18) in the semiconductor device 100 according to the second embodiment will be described.

Figure 15:
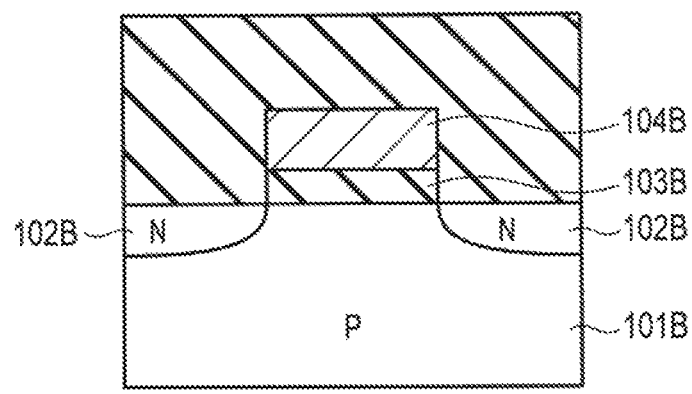
FIG. 15 is a sectional diagram illustrating a first example of a NMOS transistor of the semiconductor device according to the second embodiment.
Figure 16:
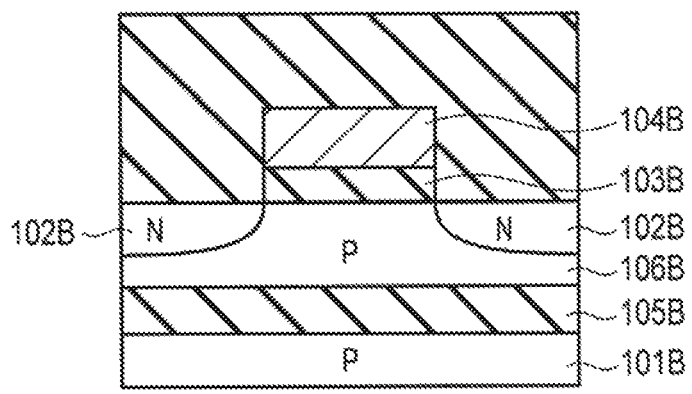
FIG. 16 is a sectional diagram illustrating a second example of the NMOS transistor of the semiconductor device according to the second embodiment.

FIG. 15 is a sectional diagram illustrating a first example of the NMOS transistor N1B in the semiconductor device 100 according to the second embodiment. FIG. 16 is a sectional diagram illustrating a second example of the NMOS transistor N1B in the semiconductor device 100 according to the second embodiment.

As illustrated in FIG. 15, the NMOS transistor N1B according to the first example has a bulk MOSFET structure. More specifically, the NMOS transistor N1B includes a P-type substrate (P-type well) 101B, N-type source drain diffusion layers 102B, a gate insulation layer 103B, and a gate electrode 104B. The N-type source drain diffusion layer 102B is provided on a surface of the P-type substrate 101B. The gate insulation layer 103B is provided on the P-type substrate 101B, and interposed between the N-type source drain diffusion layers 102B. The gate electrode 104B is provided on the gate insulation layer 103B.

As described in the first example, if the NMOS transistor N1B has the bulk MOSFET structure, the ground voltage VSS is applied to the N-type source 102B, and if the well voltage Vpwell higher than the ground voltage VSS is applied to the P-type well 101B, a PN junction is forward-biased. That is, a large current flows into the N-type source 102B from the P-type well 101B. In the second embodiment, the clamp circuit 50B is provided to prevent the PN junction from being forward-biased. The clamp circuit 50B adjusts the well voltage Vpwell so as to be equal to or higher than VNN and equal to or lower than VSS. Thereby, the well voltage Vpwell is equal to or lower than a source voltage (VSS), and it is possible to prevent the PN junction from being forward-biased.

As illustrated in FIG. 16, the NMOS transistor N1B according to the second example has a SOIMOSFET structure. That is, the NMOS transistor N1B includes an oxide film 105B, differently from the first example. The oxide film 105B is provided between the P-type substrate 101B and the N-type source drain diffusion layers 102B. In addition, a P-type semiconductor layer 106B is provided on the oxide film 105B, and the N-type source drain diffusion layers 102B are provided on a surface of the oxide film 105B.

As described in the second example, if the NMOS transistor N1B has the SOIMOSFET structure, the oxide film 105B is provided between the P-type substrate 101B and the N-type source drain diffusion layers 102B. That is, the N-type source 102B is not in contact with the P-type well 101B. Accordingly, although the ground voltage VSS is applied to the N-type source 102B and a voltage higher than the ground voltage VSS is applied to the P-type well, the forward bias of the PN junction does not become a problem. Hence, the clamp circuit 50B may not be provided in the structure of the second example.

Effects of Second Embodiment

According to the second embodiment, the substrate bias generation circuit 16B monitors variation due to temperature characteristics of the threshold voltage Vthn of the NMOS transistor N1B which is a replica. The substrate bias generation circuit 16B adjusts the substrate bias of the NMOS transistor N1B such that the variation due to the temperature characteristics of the threshold voltage Vthn is corrected.

More specifically, the substrate bias generation circuit 16B decreases the well voltage Vpwell of the NMOS transistor N1B, if the temperature is high, and increases the well voltage Vpwell of the NMOS transistor N1B, if the temperature is low. That is, if the temperature is high, the absolute value of the substrate bias increases, and if the temperature is low, the absolute value of the substrate bias decreases. Accordingly, the substrate bias generation circuit 16B can maintain the threshold voltage Vthn of the NMOS transistor N1B to be constant, regardless of the temperature, by adjusting the well voltage Vpwell. In addition, the substrate bias generation circuit 16B supplies the adjusted substrate bias to the NMOS transistors N18 of the sense amplifier 18 or the like. Thereby, it is possible to maintain the threshold voltages of the NMOS transistors N18 to be constant, and to increase performance and reliability of products.

Third Embodiment

A semiconductor device according to a third embodiment will be hereinafter described with reference to FIG. 17. The third embodiment is a modification example of the first embodiment. In the first embodiment, the substrate bias generation circuit 16A adjusts the well voltage of the PMOS transistor P1A thereby adjusting the substrate bias. In contrast to this, in the third embodiment, a source voltage of a PMOS transistor is adjusted, and thereby, the substrate bias is adjusted. In the third embodiment, description on the same points as in the first embodiment will be omitted, and different points from the first embodiment will be mainly described.

Configuration Example of Third Embodiment

First, a configuration example of a semiconductor device 100 according to the third embodiment will be described.

Figure 17:
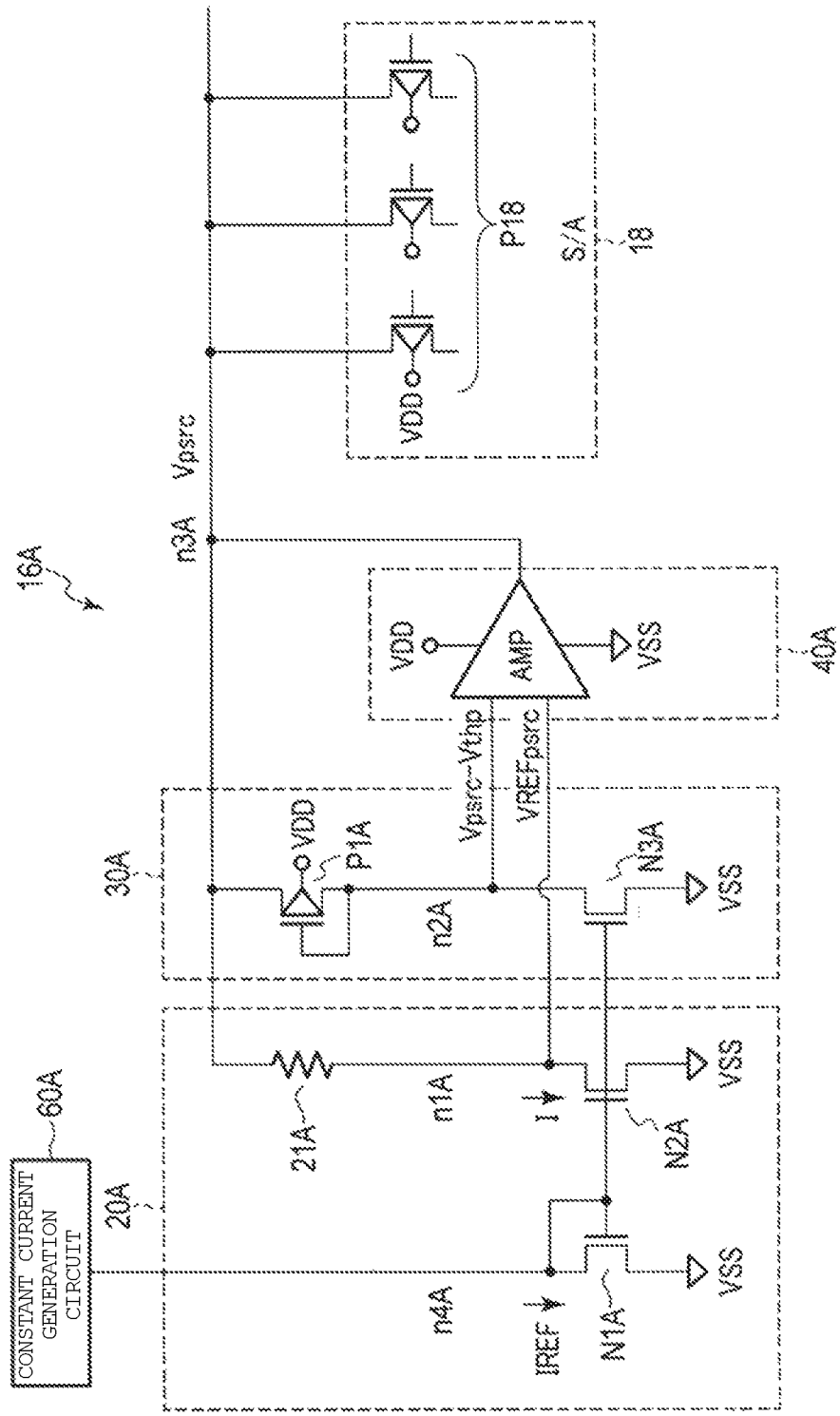
FIG. 17 is a diagram illustrating a substrate bias generation circuit of a semiconductor device according to a third embodiment.

FIG. 17 is a diagram illustrating a substrate bias generation circuit 16A of the semiconductor device 100 according to the third embodiment.

As illustrated in FIG. 17, the substrate bias generation circuit 16A includes a reference voltage generation circuit 20A, a monitoring voltage generation circuit 30A, and an amplification circuit 40A.

The reference voltage generation circuit 20A includes NMOS transistors N1A and N2A, and a resistor 21A. One terminal of the resistor 21A is electrically connected to a node n3A, and the other terminal of the resistor 21A is electrically connected to a node n1A.

The monitoring voltage generation circuit 30A includes an NMOS transistor N3A and a PMOS transistor P1A. One terminal (source) of the PMOS transistor P1A is electrically connected to the node n3A. The other terminal and a gate of the PMOS transistor P1A are electrically connected to each other, and are electrically connected to a node n2A. The power supply voltage VDD is supplied to a substrate of the PMOS transistor.

A first input terminal of the amplification circuit 40A is electrically connected to the node n1A, and a second input terminal of the amplification circuit 40A is electrically connected to the node n2A. An output terminal of the amplification circuit 40A is electrically connected to the node n3A. The node n3A is electrically connected to the one terminal (source) of the PMOS transistor P1A of the monitoring voltage generation circuit 30A. In addition, the node n3A is electrically connected to sources of the PMOS transistors P18 of the sense amplifier 18 or the like. The power supply voltage VDD is supplied to the substrates of the PMOS transistors P18.

Operation Example of Third Embodiment

Next, an operation example of the substrate bias generation circuit 16A of the semiconductor device 100 according to the third embodiment will be described.

An operation of the substrate bias generation circuit 16A will be described with reference to FIG. 17.

In the third embodiment, the reference voltage generation circuit 20A generates a reference voltage VREFpsrc (voltage Vpsrc−IR), based on a constant current I. The monitoring voltage generation circuit 30A monitors a threshold voltage Vthp of the PMOS transistor P1A which is a replica, and generates a monitoring voltage Vpsrc−Vthp. The amplification circuit 40A compares the reference voltage VREFpsrc with the monitoring voltage Vpsrc−Vthp, and generates a source voltage Vpsrc such that the reference voltage VREFpsrc is equal to the monitoring voltage Vpsrc−Vthp, based on the comparison result. A substrate bias of the PMOS transistors P1A and P18 is adjusted by the source voltage Vpsrc, and threshold voltages thereof are constant regardless of temperature. Hereinafter, description thereon will be made more specifically.

As illustrated in FIG. 17, the constant current I based on the constant current IREF flows through a path including the resistor 21A and the NMOS transistor N2A in the reference voltage generation circuit 20A. Thereby, a voltage Vpsrc−IR which drops by a voltage IR (R is a resistance value of the resistor 21A) from the source voltage Vpsrc of the node n3A is applied to the node n1A. The voltage Vpsrc−IR becomes the reference voltage VREFpsrc.

Meanwhile, the NMOS transistors N1A and N3A form a current mirror circuit. Accordingly, the constant current based on the constant current IREF flows through a path including the PMOS transistor P1A and the NMOS transistor N3A. In addition, the PMOS transistor P1A is diode-connected. Accordingly, the monitoring voltage Vpsrc−Vthp which drops by the threshold voltage Vthp of the PMOS transistor P1A from the source voltage Vpsrc of the node n3A is applied to the node n2A.

The reference voltage VREFpsrc (voltage Vpsrc−IR) is supplied to the first input terminal of the amplification circuit 40A, and the monitoring voltage Vpsrc−Vthp is supplied to the second input terminal of the amplification circuit 40A. The amplification circuit 40A adjusts the substrate bias of the PMOS transistor P1A, such that the voltage Vpsrc−IR is equal to the monitoring voltage Vpsrc−Vthp, that is, such that the threshold voltage Vthp is equal to the voltage IR. More specifically, the amplification circuit 40A generates the source voltage Vpsrc, and feeds back the source voltage Vpsrc to a source of the PMOS transistor P1A. A voltage range is VSS Vpsrc VDD.

There is a case where the source voltage Vpsrc needs to be equal to or higher than VSS+Vthp so as to operate the PMOS transistor P1A. Accordingly, a clamp circuit which adjusts the voltage range of the source voltage Vpsrc may be provided between the amplification circuit 40A and the node n3A.

In the third embodiment, the substrate bias is a voltage difference between the source voltage Vpsrc and the power supply voltage VDD.

Because the source voltage Vpsrc is applied to the source of the PMOS transistor P1A, the threshold voltage Vthp of the PMOS transistor P1A is equal to the voltage IR. That is, the threshold voltage Vthp of the PMOS transistor P1A is maintained to be constant regardless of temperature. Accordingly, the generated source voltage Vpsrc is applied to sources of the PMOS transistors P18 of the sense amplifier 18 or the like. Thereby, threshold voltages of the PMOS transistors P18 are maintained to be constant regardless of the temperature.

Effects of Third Embodiment

According to the third embodiment, the substrate bias generation circuit 16A monitors variation due to temperature characteristics of the threshold voltage Vthp of the PMOS transistor P1A which is a replica. In addition, the substrate bias generation circuit 16A adjusts the substrate bias of the PMOS transistor P1A by adjusting the source voltage Vpsrc of the PMOS transistor P1A such that the variation of the threshold voltage Vthp is corrected. Thereby, it is possible to obtain the same effects as in the first embodiment.

Fourth Embodiment

A semiconductor device according to a fourth embodiment will be hereinafter described with reference to FIG. 18. The fourth embodiment is a modification example of the second embodiment. In the second embodiment, the substrate bias generation circuit 16B adjusts the well voltage of the NMOS transistor N1B, thereby adjusting the substrate bias. In contrast to this, in the fourth embodiment, a source voltage of an NMOS transistor is adjusted, and thereby, the substrate bias is adjusted. In the fourth embodiment, description on the same points as in the second embodiment will be omitted, and different points from the second embodiment will be mainly described.

Configuration Example of Fourth Embodiment

First, a configuration example of a semiconductor device 100 according to the fourth embodiment will be described.

Figure 18:
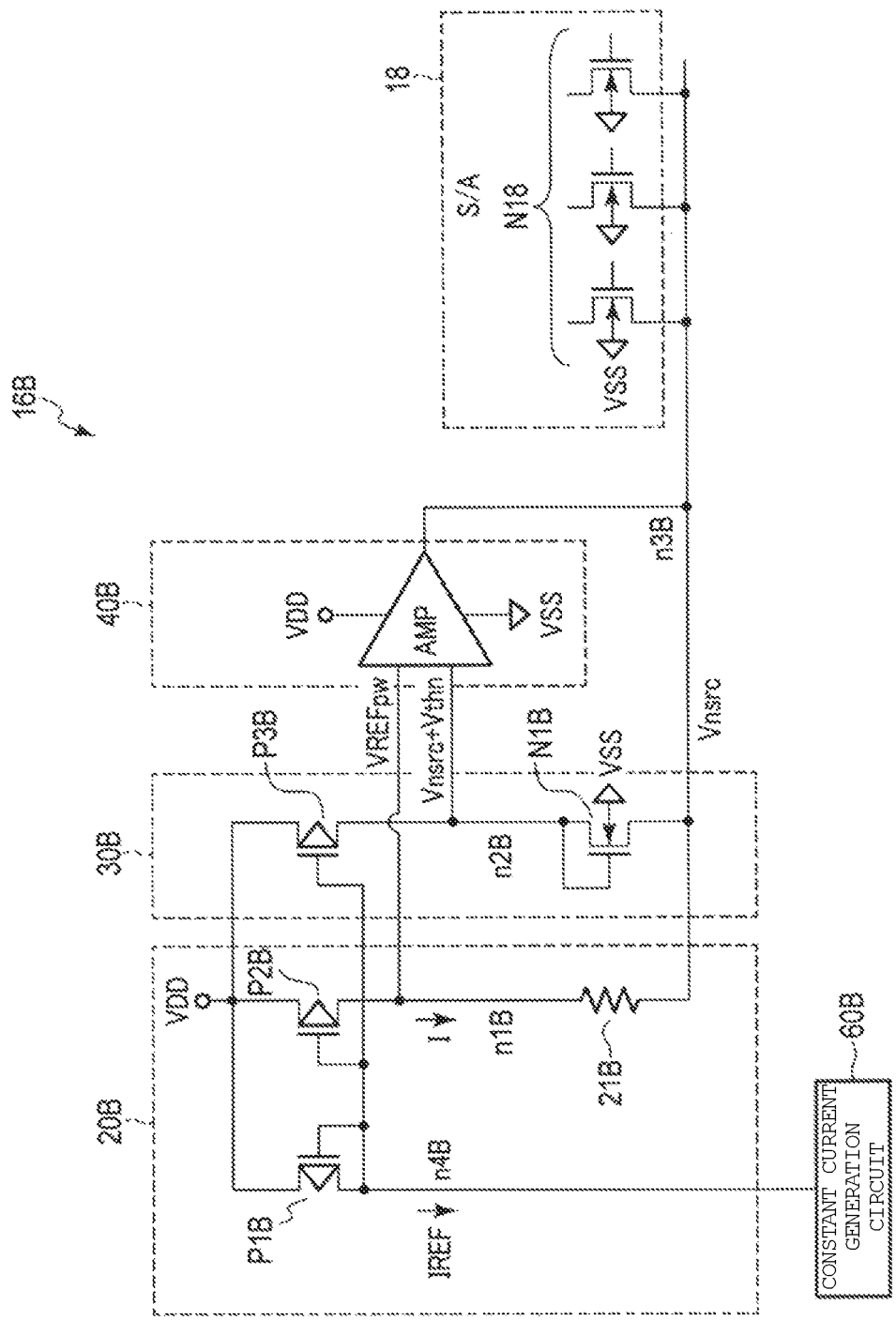
FIG. 18 is a diagram illustrating a substrate bias generation circuit of a semiconductor device according to a fourth embodiment.

FIG. 18 is a diagram illustrating a substrate bias generation circuit 16B of the semiconductor device 100 according to the fourth embodiment.

As illustrated in FIG. 18, the substrate bias generation circuit 16B includes a reference voltage generation circuit 20B, a monitoring voltage generation circuit 30B, and an amplification circuit 40B.

The reference voltage generation circuit 20B includes PMOS transistors P1B and P2B, and a resistor 21B. One terminal of the resistor 21B is electrically connected to a node n1B, and the other terminal of the resistor 21B is electrically connected to a node n3B.

The monitoring voltage generation circuit 30B includes a PMOS transistor P3B and an NMOS transistor N1B. One terminal and a gate of the NMOS transistor N1B is electrically connected to each other, and are electrically connected to a node n2B. The other terminal of the NMOS transistor N1B is electrically connected to the node n3B. The ground voltage VSS is supplied to a substrate of the NMOS transistor N1B.

A first input terminal of the amplification circuit 40B is electrically connected to the node n1B, and a second input terminal of the amplification circuit 40B is electrically connected to the node n2B. An output terminal of the amplification circuit 40B is electrically connected to the node n3B. The node n3B is electrically connected to the other terminal (source) of the NMOS transistor N1B of the monitoring voltage generation circuit 30B. In addition, the node n3B is electrically connected to sources of NMOS transistors N18 of the sense amplifier 18 or the like. The ground voltage VSS is supplied to substrates of the NMOS transistors N18.

Operation Example of Fourth Embodiment

Next, an operation example of the substrate bias generation circuit 16B of the semiconductor device 100 according to the fourth embodiment will be described.

An operation of the substrate bias generation circuit 16B will be described with reference to FIG. 18.

In the fourth embodiment, the reference voltage generation circuit 20B generates a reference voltage VREFnsrc (voltage Vnsrc+IR), based on a constant current I. The monitoring voltage generation circuit 30B monitors a threshold voltage Vthn of the NMOS transistor N1B which is a replica, and generates a monitoring voltage Vnsrc+Vthn. The amplification circuit 40B compares the reference voltage VREFnsrc with the monitoring voltage Vnsrc+Vthn, and generates a source voltage Vnsrc such that the reference voltage VREFnsrc is equal to the monitoring voltage Vnsrc+Vthn, based on the comparison result. A substrate bias of the NMOS transistors N1B and N18 is adjusted by the source voltage Vnsrc, and threshold voltages thereof are constant regardless of temperature. Hereinafter, description thereon will be made more specifically.

As illustrated in FIG. 18, the constant current I based on the constant current IREF flows through a path including the resistor 21B and the PMOS transistor P2B in the reference voltage generation circuit 20B. Thereby, a voltage Vnsrc+IR which increases by a voltage IR (R is a resistance value of the resistor 21B) from the source voltage Vnsrc of the node n3B is applied to the node n1B. The voltage Vnsrc+IR becomes the reference voltage VREFnsrc.

Meanwhile, the PMOS transistors P1B and P3B form a current mirror circuit. Accordingly, the constant current based on the constant current IREF flows through a path including the NMOS transistor N1B and the PMOS transistor P3B. In addition, the NMOS transistor N1B is diode-connected. Accordingly, the monitoring voltage Vnsrc+Vthn which increases by the threshold voltage Vthn of the NMOS transistor N1B from the source voltage Vnsrc of the node n3B is applied to the node n2B.

The reference voltage VREFnsrc (voltage Vnsrc+IR) is supplied to the first input terminal of the amplification circuit 40B, and the monitoring voltage Vnsrc+Vthn is supplied to the second input terminal of the amplification circuit 40B. The amplification circuit 40B adjusts the substrate bias of the NMOS transistor N1B, such that the voltage Vnsrc+IR is equal to the monitoring voltage Vnsrc+Vthn, that is, such that the threshold voltage Vthn is equal to the voltage IR. More specifically, the amplification circuit 40B generates the source voltage Vnsrc, and feeds back the source voltage Vnsrc to a source of the NMOS transistor N1B. A voltage range is VSS≤Vnsrc≤VDD.

There is a case where the source voltage Vnsrc needs to be equal to or lower than VDD−Vthn so as to operate the NMOS transistor N1B. Accordingly, a clamp circuit which adjusts the voltage range of the source voltage Vnsrc may be provided between the amplification circuit 40B and the node n3B.

In the fourth embodiment, the substrate bias is a voltage difference between the source voltage Vnsrc and the ground voltage VSS.

Because the source voltage Vnsrc is applied to the source of the NMOS transistor N1B, the threshold voltage Vthn of the NMOS transistor N1B is equal to the voltage IR. That is, the threshold voltage Vthn of the NMOS transistor N1B is maintained to be constant regardless of temperature. Accordingly, the generated source voltage Vnsrc is applied to sources of the NMOS transistors N18 of the sense amplifier 18 or the like. Thereby, threshold voltages of the NMOS transistors N18 are maintained to be constant regardless of the temperature.

Effects of Fourth Embodiment

According to the fourth embodiment, the substrate bias generation circuit 16B monitors variation due to temperature characteristics of the threshold voltage Vthn of the NMOS transistor N1B which is a replica. In addition, the substrate bias generation circuit 16B adjusts the substrate bias of the NMOS transistor N1B by adjusting the source voltage Vnsrc of the NMOS transistor N1B such that the variation of the threshold voltage Vthn is corrected. Thereby, it is possible to obtain the same effects as in the second embodiment.

Fifth Embodiment

A semiconductor device according to a fifth embodiment will be hereinafter described with reference to FIG. 19 to FIG. 21. In the first embodiment, the substrate bias generation circuit 16A adjusts the substrate bias of the PMOS transistor P1A, thereby maintaining the threshold voltage of the PMOS transistor P1A to be constant regardless of temperature. In contrast to this, in the fifth embodiment, the substrate bias generation circuit 16A appropriately shifts the threshold voltage Vthp2 of the PMOS transistor P1A. At this time, the substrate bias generation circuit 16A maintains the amount of shift (slope) of the threshold voltage Vthp2 regardless of the temperature. In the fifth embodiment, description on the same points as in the first embodiment will be omitted, and different points from the first embodiment will be mainly described.

Configuration Example of Fifth Embodiment

First, a configuration example of a semiconductor device 100 according to the fifth embodiment will be described.

Figure 19:
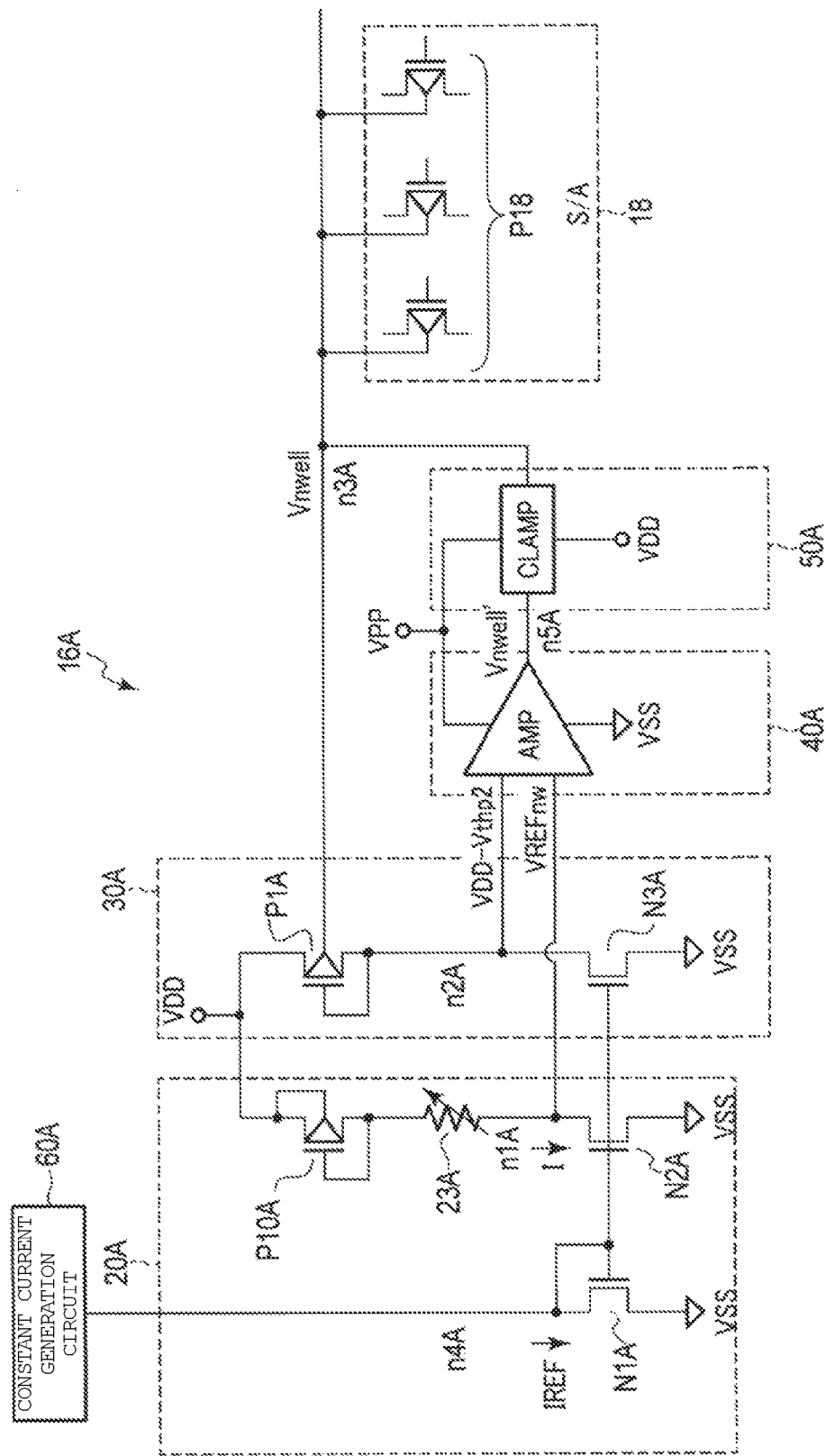
FIG. 19 is a diagram illustrating a substrate bias generation circuit of a semiconductor device according to a fifth embodiment.

FIG. 19 is a diagram illustrating a substrate bias generation circuit 16A of a semiconductor device 100 according to the fifth embodiment.

As illustrated in FIG. 19, the substrate bias generation circuit 16A includes a reference voltage generation circuit 20A, a monitoring voltage generation circuit 30A, an amplification circuit 40A, and the clamp circuit 50A.

The reference voltage generation circuit 20A includes NMOS transistors N1A and N2A, a PMOS transistor P10A, and a resistor 23A. One terminal and a substrate of the PMOS transistor P10A are electrically connected to each other, and receive the power supply voltage VDD. The other terminal and a gate of the PMOS transistor P10A are electrically connected to each other, and are electrically connected to one terminal of the resistor 23A. The other terminal of the resistor 23A is electrically connected to a node n1A. The resistor 23A has a variable resistance value. The resistor 23A is, for example, a variable resistance element. In addition, the resistor 23A includes, for example, multiple resistors, and resistance thereof is appropriately switched by a switch.

Operation Example of Fifth Embodiment

Next, an operation example of the substrate bias generation circuit 16A of the semiconductor device 100 according to the fifth embodiment will be described.

An operation of the substrate bias generation circuit 16A will be described with reference to FIG. 19.

In the fifth embodiment, the reference voltage generation circuit 20A generates a reference voltage VREFnw (VDD−(Vthp1+IR)), based on a constant current I. The monitoring voltage generation circuit 30A monitors a threshold voltage Vthp2 of the PMOS transistor P1A which is a replica, and generates a monitoring voltage VDD−Vthp2. The amplification circuit 40A compares the reference voltage VREFnw with the monitoring voltage VDD−Vthp2, and generates a well voltage Vnwell' such that the reference voltage VREFnw is equal to the monitoring voltage VDD−Vthp2, based on the comparison result. A substrate bias of the PMOS transistors P1A and P18 is adjusted by the well voltage Vnwell' (or well voltage Vnwell).

At this time, a resistance value of the resistor 23A is changed, and thereby, the threshold voltage Vthp2 is shifted. That is, the reference voltage generation circuit 20A changes the resistance value of the resistor 23A, thereby adjusting the substrate bias of the PMOS transistor P1A. Thereby, the reference voltage generation circuit 20A maintains the amount of shift of the threshold voltage Vthp2 to be constant regardless of temperature, by using the threshold voltage Vthp1 as a reference. Hereinafter, an operation of the substrate bias generation circuit 16A will be described in detail.

As illustrated in FIG. 19, the constant current IREF which is generated by the constant current generation circuit 60A flows through the node n4A in the reference voltage generation circuit 20A. The NMOS transistors N1A and N2A form a current mirror circuit. Accordingly, the constant current I based on the constant current IREF flows through a path including the NMOS transistor N2A, the resistor 23A, and the PMOS transistor P10A. Hence, a voltage VDD−(Vthp1+IR) which drops by the threshold voltage Vthp1 of the PMOS transistor P10A and the voltage IR from the power supply voltage VDD is applied to the node n1A. The threshold voltage Vthp1 has the same temperature characteristics as the threshold voltage Vthp2, and is a threshold voltage of the PMOS transistor P10A if the substrate bias is not applied. The voltage VDD−(Vthp1+IR) becomes the reference voltage VREFnw.

Meanwhile, the NMOS transistors N1A and N3A form a current mirror circuit. Accordingly, the constant current based on the constant current IREF flows through a path including the PMOS transistor P1A and the NMOS transistor N3A. In addition, the PMOS transistor P1A is diode-connected. Accordingly, the monitoring voltage VDD−Vthp2 which drops by the threshold voltage Vthp2 of the PMOS transistor P1A from the power supply voltage VDD is applied to the node n2A.

The reference voltage VREFnw (voltage VDD−(Vthp1+IR)) is supplied to the first input terminal of the amplification circuit 40A, and the monitoring voltage VDD−Vthp2 is supplied to the second input terminal of the amplification circuit 40A. The amplification circuit 40A adjusts the substrate bias of the PMOS transistor P1A, such that the voltage VDD−(Vthp1+IR) is equal to the monitoring voltage VDD−Vthp2, that is, such that the threshold voltage Vthp2 is equal to the voltage Vthp1+IR. More specifically, the amplification circuit 40A generates a voltage Vnwell', and feeds back the voltage Vnwell' to the substrate of the PMOS transistor P1A through the clamp circuit 50A.

The clamp circuit 50A adjusts a voltage range of the voltage Vnwell', and generates the well voltage Vnwell. The well voltage Vnwell is supplied to the substrate of the PMOS transistor P1A. The voltage range is VDD≤Vnwell≤VPP.

Because the well voltage Vnwell is applied to the substrate of the PMOS transistor P1A, the threshold voltage Vthp2 of the PMOS transistor P1A is equal to the voltage Vthp1+IR. Here, the threshold voltage Vthp2 has the same temperature characteristics as the threshold voltage Vthp1. Meanwhile, the threshold voltage Vthp2 is adjusted by the substrate bias, and the threshold voltage Vthp1 is not adjusted by the substrate bias. That is, the amount of shift of the threshold voltage Vthp2 due to the substrate bias corresponds to the amount of change of the voltage IR, and is constant regardless of the temperature. Hence, as the resistance value R of the resistor 23A is changed, the threshold voltage vthp2 is shifted by using the threshold voltage Vrhp1 as a reference.

Effects of Fifth Embodiment

Figure 20:
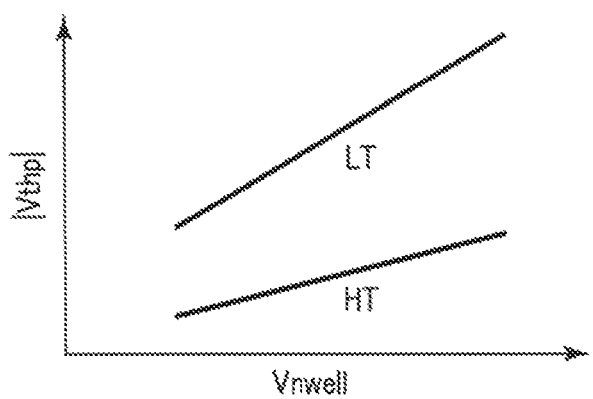
FIG. 20 is a diagram illustrating a relationship between the well voltage and the threshold voltage of the PMOS transistor of the semiconductor device according to the comparative example.
Figure 21:
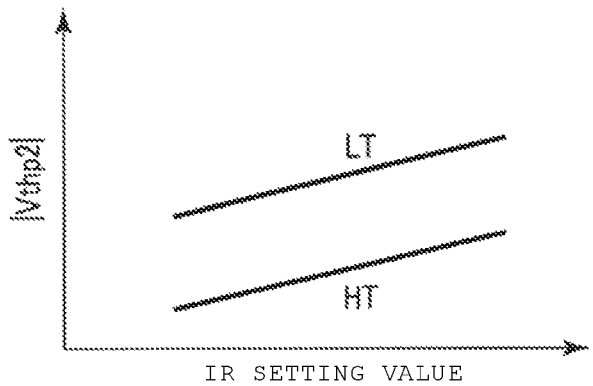
FIG. 21 is a diagram illustrating a relationship between an IR setting value and a threshold voltage of a PMOS transistor in the semiconductor device according to the fifth embodiment.

FIG. 20 is a diagram illustrating a relationship between the well voltage and the threshold voltage of the PMOS transistor in the semiconductor device according to the comparative example. FIG. 21 is a diagram illustrating a relationship between an IR setting value and the threshold voltage Vthp2 of the PMOS transistor P1A (and P18) in the semiconductor device 100 according to the fifth embodiment.

In the comparative example, the well voltage Vnwell (substrate bias) is adjusted, and thereby the threshold voltage Vthp of the PMOS transistor is shifted. At this time, the amounts of shift (slope) of the threshold voltage Vthp with respect to the amount of change of the well voltage Vnwell are different from each other, at the time of low temperature (LT) and high temperature (HT), as illustrated in FIG. 20. Accordingly, if temperatures are different from each other, the threshold voltage Vthp of the PMOS transistor is hard to be set to a desirable threshold voltage.

In contrast to this, in the fifth embodiment, the substrate bias generation circuit 16A adjusts the well voltage (substrate bias), thereby shifting the threshold voltage Vthp2 of the PMOS transistor P1A according to temperature characteristics by using the threshold voltage Vthp1 of the PMOS transistor P10A with the same temperature characteristics as a reference. At this time, the amount of shift of the threshold voltage Vthp2 is determined by the voltage IR, that is, the resistance value R of the resistor 23A. Accordingly, as illustrated in FIG. 21, the amount of shift (slope) of the threshold voltage Vthp2 is maintained to be constant (voltage IR) regardless of temperature. Hence, the substrate bias generation circuit 16A can easily set the threshold voltage Vthp2 of the PMOS transistor P2A to a desirable threshold voltage, even if temperatures are different from each other.

Sixth Embodiment

A semiconductor device according to a sixth embodiment will be hereinafter described with reference to FIG. 22. In the second embodiment, the substrate bias generation circuit 16B adjusts the substrate bias of the NMOS transistor N1B, thereby maintaining the threshold voltage of the NMOS transistor N1B to be constant regardless of temperature. In contrast to this, in the sixth embodiment, the substrate bias generation circuit 16B appropriately shifts a threshold voltage Vthn2 of the NMOS transistor N1B. At this time, the substrate bias generation circuit 16B maintains the amount of shift (slope) of the threshold voltage Vthn2 regardless of temperature. In the sixth embodiment, description on the same points as in the second embodiment will be omitted, and different points from the second embodiment will be mainly described.

Configuration Example of Sixth Embodiment

First, a configuration example of a semiconductor device 100 according to the sixth embodiment will be described.

Figure 22:
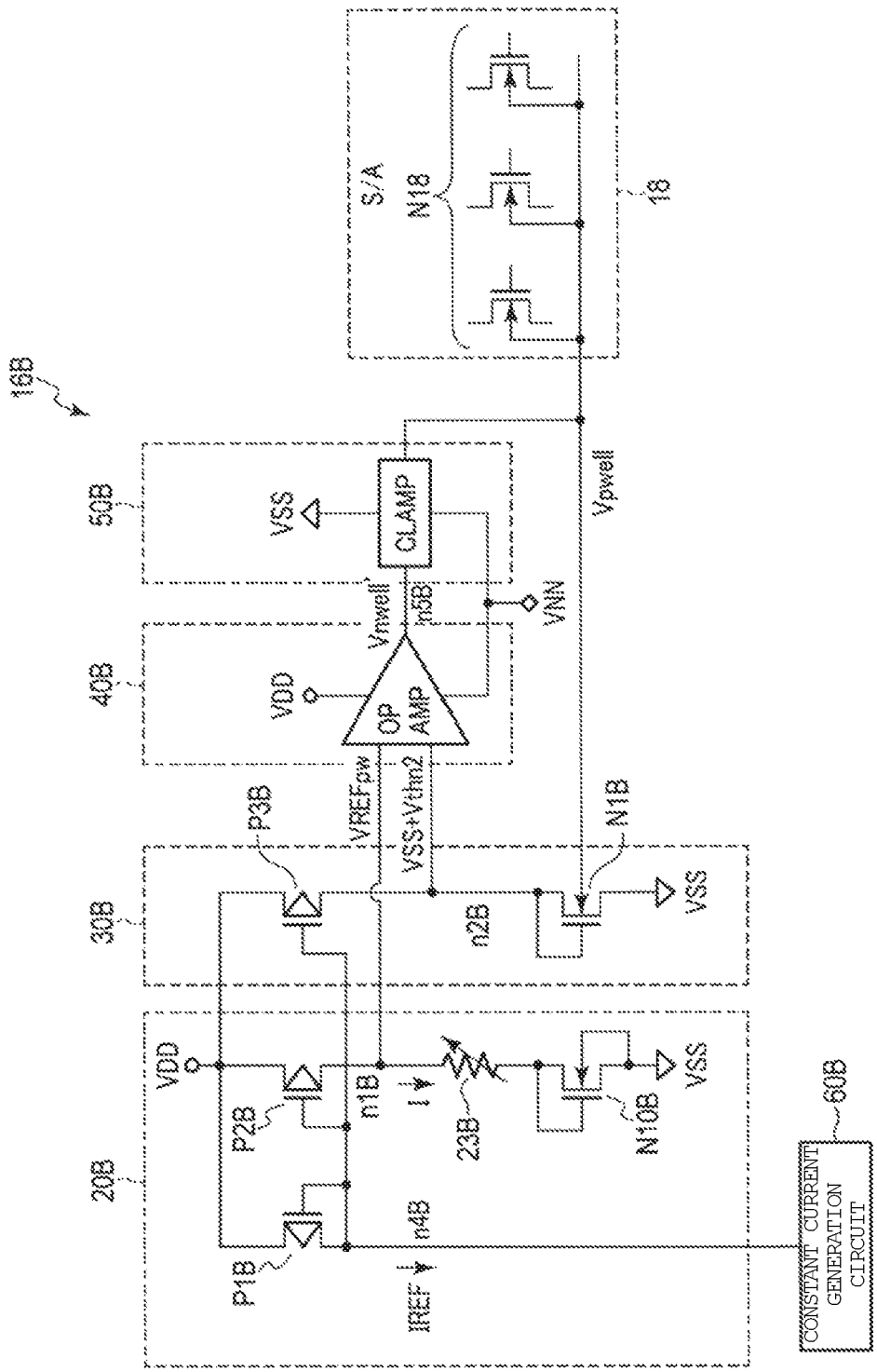
FIG. 22 is a diagram illustrating a substrate bias generation circuit of a semiconductor device according to a sixth embodiment.

FIG. 22 is a diagram illustrating a substrate bias generation circuit 16B in a semiconductor device 100 according to the sixth embodiment.

As illustrated in FIG. 22, the substrate bias generation circuit 16B includes a reference voltage generation circuit 20B, a monitoring voltage generation circuit 30B, an amplification circuit 40B, and a clamp circuit 50B.

The reference voltage generation circuit 20B includes PMOS transistors P1B and P2B, an NMOS transistor N10B, and a resistor 23B. One terminal and a substrate of the NMOS transistor N10B are electrically connected to each other, and receive the ground voltage VSS. The other terminal and a gate of the NMOS transistor N10B are electrically connected to each other, and are electrically connected to one terminal of the resistor 23B. The other terminal of the resistor 23B is electrically connected to a node n1B. The resistor 23B has a variable resistance value. The resistor 23B is, for example, a variable resistance element. In addition, the resistor 23B includes, for example, multiple resistors, and resistance thereof is appropriately switched by a switch.

Operation Example of Sixth Embodiment

Next, an operation example of the substrate bias generation circuit 16B of the semiconductor device 100 according to the sixth embodiment will be described.

An operation of the substrate bias generation circuit 16B will be described with reference to FIG. 22.

In the sixth embodiment, the reference voltage generation circuit 20B generates a reference voltage VREFpw (VSS+(Vthn1+IR)), based on a constant current I. The monitoring voltage generation circuit 30B monitors a threshold voltage Vthn2 of the NMOS transistor N1B which is a replica, and generates a monitoring voltage VSS+Vthn2. The amplification circuit 40B compares the reference voltage VREFpw with the monitoring voltage VSS+Vthn2, and generates a well voltage Vpwell' such that the reference voltage VREFpw is equal to the monitoring voltage VSS+Vthn2, based on the comparison result. A substrate bias of the NMOS transistors N1B and N18 is adjusted by the well voltage Vpwell' (or well voltage Vpwell).

At this time, a resistance value of the resistor 23B is changed, and thereby, the threshold voltage Vthn2 is shifted. That is, the reference voltage generation circuit 20B changes the resistance value of the resistor 23B, thereby adjusting the substrate bias of the NMOS transistor N1B. Thereby, the reference voltage generation circuit 20B maintains the amount of shift of the threshold voltage Vthn2 to be constant regardless of temperature, by using the threshold voltage Vthn1 as a reference. Hereinafter, an operation of the substrate bias generation circuit 16B will be described in detail.

As illustrated in FIG. 22, the constant current IREF which is generated by the constant current generation circuit 60B flows through a node n4B in the reference voltage generation circuit 20B. The PMOS transistors P1B and P2B form a current mirror circuit. Accordingly, the constant current I based on the constant current IREF flows through a path including the PMOS transistor P2B, the resistor 23B, and the NMOS transistor N10B. Hence, a voltage VSS+(Vthn1+IR) which increases by the threshold voltage Vthn1 of the NMOS transistor N10B and the voltage IR from the ground voltage VSS is applied to a node n1B. The threshold voltage Vthn1 has the same temperature characteristics as the threshold voltage Vthn2, and is a threshold voltage of the NMOS transistor N10B if the substrate bias is not applied. The voltage VSS+(Vthn1+IR) becomes the reference voltage VREFpw.

Meanwhile, the PMOS transistors P1B and P3B form a current mirror circuit. Accordingly, the constant current based on the constant current IREF flows through a path including the NMOS transistor N1B and the PMOS transistor P3B. In addition, the NMOS transistor N1B is diode-connected. Accordingly, the monitoring voltage VSS+Vthn2 which increases by the threshold voltage Vthn2 of the NMOS transistor N1B from the ground voltage VSS is applied to a node n2B.

The reference voltage VREFpw (voltage VSS+(Vthn1+IR)) is supplied to the first input terminal of the amplification circuit 40B, and the monitoring voltage VSS+Vthn2 is supplied to the second input terminal of the amplification circuit 40B. The amplification circuit 40B adjusts the substrate bias of the NMOS transistor N1B, such that the voltage VSS+(Vthn1+IR) is equal to the voltage VSS+

Vthn2, that is, such that the threshold voltage Vthn2 is equal to the voltage Vthn1+IR. More specifically, the amplification circuit 40B generates a voltage Vpwell', and feeds back the voltage Vpwell' to the substrate of the NMOS transistor N1B through the clamp circuit 50B.

The clamp circuit 50B adjusts a voltage range of the voltage Vpwell', and generates the well voltage Vpwell. The well voltage Vpwell is supplied to the substrate of the NMOS transistor N1B. The voltage range is VNN≤Vpwell-≤VSS.

Because the well voltage Vpwell is applied to the substrate of the NMOS transistor N1B, the threshold voltage Vthn2 of the NMOS transistor N1B is equal to the voltage Vthn1+IR. The threshold voltage Vthn2 has the same temperature characteristics as the threshold voltage Vthn1. Meanwhile, the threshold voltage Vthn2 is adjusted by the substrate bias, and the threshold voltage Vthn1 is not adjusted by the substrate bias. That is, the amount of shift of the threshold voltage Vthn2 due to the substrate bias corresponds to the amount of change of the voltage IR, and is constant regardless of temperature. Hence, as the resistance value R of the resistor 23B is changed, the threshold voltage Vthn2 is shifted by using the threshold voltage Vthn1 as a reference.

Effects of Sixth Embodiment

According to the sixth embodiment, the substrate bias generation circuit 16B adjusts the well voltage (substrate bias), thereby shifting the threshold voltage Vthn2 of the NMOS transistor N1B with temperature characteristics by using the threshold voltage Vthn1 of the NMOS transistor N10B with the same temperature characteristics as a reference. At this time, the amount of shift of the threshold voltage Vthn2 is determined by the voltage IR, that is, the resistance value R of the resistor 23B. Accordingly, the amount of shift (slope) of the threshold voltage Vthn2 is constant (voltage IR) regardless of the temperature. Hence, the substrate bias generation circuit 16B can easily set the threshold voltage Vthn2 of the NMOS transistor N2B to a desirable threshold voltage, even if temperatures are different from each other.

Seventh Embodiment

A semiconductor device according to a seventh embodiment will be hereinafter described with reference to FIG. 23. The seventh embodiment is a modification example of the fifth embodiment. In the fifth embodiment, the substrate bias generation circuit 16A adjusts the well voltage of the PMOS transistor P1A, thereby adjusting substrate bias. In contrast to this, in the seventh embodiment, a source voltage of a PMOS transistor P1A is adjusted, and thereby, the substrate bias is adjusted. In the seventh embodiment, description on the same points as in the fifth embodiment will be omitted, and different points from the fifth embodiment will be mainly described.

Configuration Example of Seventh Embodiment

First, a configuration example of a semiconductor device 100 according to the seventh embodiment will be described.

Figure 23:
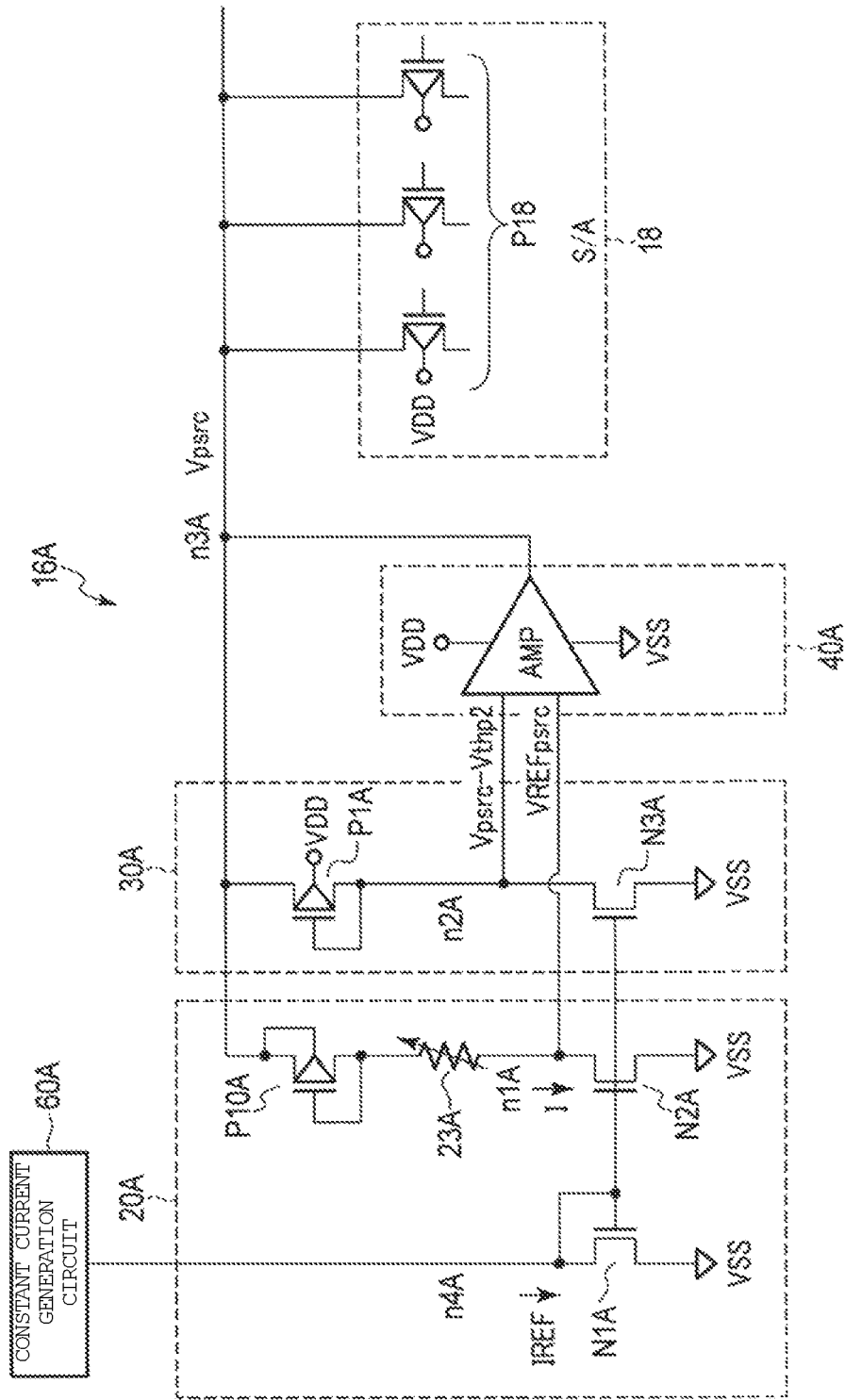
FIG. 23 is a diagram illustrating a substrate bias generation circuit of a semiconductor device according to a seventh embodiment.

FIG. 23 is a diagram illustrating a substrate bias generation circuit 16A of a semiconductor device 100 according to the seventh embodiment.

As illustrated in FIG. 23, the substrate bias generation circuit 16A includes a reference voltage generation circuit 20A, a monitoring voltage generation circuit 30A, and an amplification circuit 40A.

The reference voltage generation circuit 20A includes NMOS transistors N1A and N2A, a PMOS transistor P10A, and a resistor 23A. One terminal and a substrate of the PMOS transistor P10A are electrically connected to each other, and are electrically connected to a node n3A. The other terminal and a gate of the PMOS transistor P10A are diode-connected, and are electrically connected to one terminal of the resistor 23A. The other terminal of the resistor 23A is electrically connected to a node n1A.

The monitoring voltage generation circuit 30A includes an NMOS transistor N3A and a PMOS transistor P1A. One terminal (source) of the PMOS transistor P1A is electrically connected to the node n3A. The other terminal and a gate of the PMOS transistor P1A are diode-connected, and are electrically connected to a node n2A. The power supply voltage VDD is supplied to a substrate of the PMOS transistor.

A first input terminal of the amplification circuit 40A is electrically connected to the node n1A, and a second input terminal of the amplification circuit 40A is electrically connected to the node n2A. An output terminal of the amplification circuit 40A is electrically connected to the node n3A. The node n3A is electrically connected to the one terminal (source) of the PMOS transistor P1A of the monitoring voltage generation circuit 30A. In addition, the node n3A is electrically connected to sources of the PMOS transistors P18 of the sense amplifier 18 or the like. The power supply voltage VDD is supplied to the substrates of the PMOS transistors P18.

Operation Example of Seventh Embodiment

Next, an operation example of the substrate bias generation circuit 16A of the semiconductor device 100 according to the seventh embodiment will be described.

An operation of the substrate bias generation circuit 16A will be described with reference to FIG. 23.

In the seventh embodiment, the reference voltage generation circuit 20A generates a reference voltage VREFpsrc (Vpsrc−(Vthp1+IR)), based on a constant current I. The monitoring voltage generation circuit 30A monitors a threshold voltage Vthp2 of the PMOS transistor P1A which is a replica, and generates a monitoring voltage Vpsrc−Vthp2. The amplification circuit 40A compares the reference voltage VREFpsrc with the monitoring voltage Vpsrc−Vthp2, and generates a source voltage Vpsrc such that the reference voltage VREFpsrc is equal to the monitoring voltage Vpsrc−Vthp2, based on the comparison result. A substrate bias of the PMOS transistors P1A and P18 is adjusted by the source voltage Vpsrc. Hereinafter, the operation of the substrate bias generation circuit 16A will be described in detail.

As illustrated in FIG. 23, the constant current I based on the constant current IREF flows through a path including the NMOS transistor N2A, the resistor 23A, and the PMOS transistor P10A in the reference voltage generation circuit 20A. Thereby, a voltage Vpsrc−(Vthp1+IR) which drops by the threshold voltage Vthp1 and a voltage IR from the source voltage Vpsrc of the node n3A is applied to the node n1A. The voltage Vpsrc−(Vthp1+IR) becomes the reference voltage VREFpsrc.

Meanwhile, the NMOS transistors N1A and N3A form a current mirror circuit. Accordingly, the constant current based on the constant current IREF flows through a path including the PMOS transistor P1A and the NMOS transistor N3A. In addition, the PMOS transistor P1A is diode-connected. Accordingly, the monitoring voltage Vpsrc−Vthp2 which drops by the threshold voltage Vthp2 of the PMOS transistor P1A from the source voltage Vpsrc of the node n3A is applied to the node n2A.

The reference voltage VREFpsrc (voltage Vpsrc−(Vthp1+IR)) is supplied to the first input terminal of the amplification circuit 40A, and the monitoring voltage Vpsrc−Vthp2 is supplied to the second input terminal of the amplification circuit 40A. The amplification circuit 40A adjusts the substrate bias of the PMOS transistor P1A, such that the voltage Vpsrc−(Vthp1+IR) is equal to the monitoring voltage Vpsrc−Vthp2, that is, such that the threshold voltage Vthp2 is equal to the voltage (Vthp1+IR). More specifically, the amplification circuit 40A generates the source voltage Vpsrc, and feeds back the source voltage Vpsrc to a source of the PMOS transistor P1A. A voltage range is VSS−≤Vpsrc≤VDD.

There is a case where the source voltage Vpsrc needs to be equal to or higher than VSS+Vthp so as to operate the PMOS transistor P1A. Accordingly, a clamp circuit which adjusts the voltage range of the source voltage Vpsrc may be provided between the amplification circuit 40A and the node n3A.

Because the source voltage Vpsrc is applied to the source of the PMOS transistor P1A, the threshold voltage Vthp2 of the PMOS transistor P1A is equal to the voltage Vthp1+IR.

Effects of Seventh Embodiment

According to the seventh embodiment, the substrate bias generation circuit 16A adjusts the source voltage (substrate bias), thereby shifting the threshold voltage Vthp2 of the PMOS transistor P1A with temperature characteristics by using the threshold voltage Vthp1 of the PMOS transistor P10A with the same temperature characteristics as a reference. At this time, the amounts of shift of the threshold voltage Vthp2 is determined by the voltage IR, that is, the resistance value R of the resistor 23A. Thereby, the same effects as in the fifth embodiment can be obtained.

Eighth Embodiment

A semiconductor device according to an eighth embodiment will be hereinafter described with reference to FIG. 24. The eighth embodiment is a modification example of the sixth embodiment. In the sixth embodiment, the substrate bias generation circuit 16B adjusts the well voltage of the NMOS transistor N1B, thereby adjusting the substrate bias. In contrast to this, in the eighth embodiment, a source voltage of an NMOS transistor N1B is adjusted, and thereby, the substrate bias is adjusted. In the eighth embodiment, description on the same points as in the sixth embodiment will be omitted, and different points from the sixth embodiment will be mainly described.

Configuration Example of Eighth Embodiment

First, a configuration example of a semiconductor device 100 according to the eighth embodiment will be described.

Figure 24:
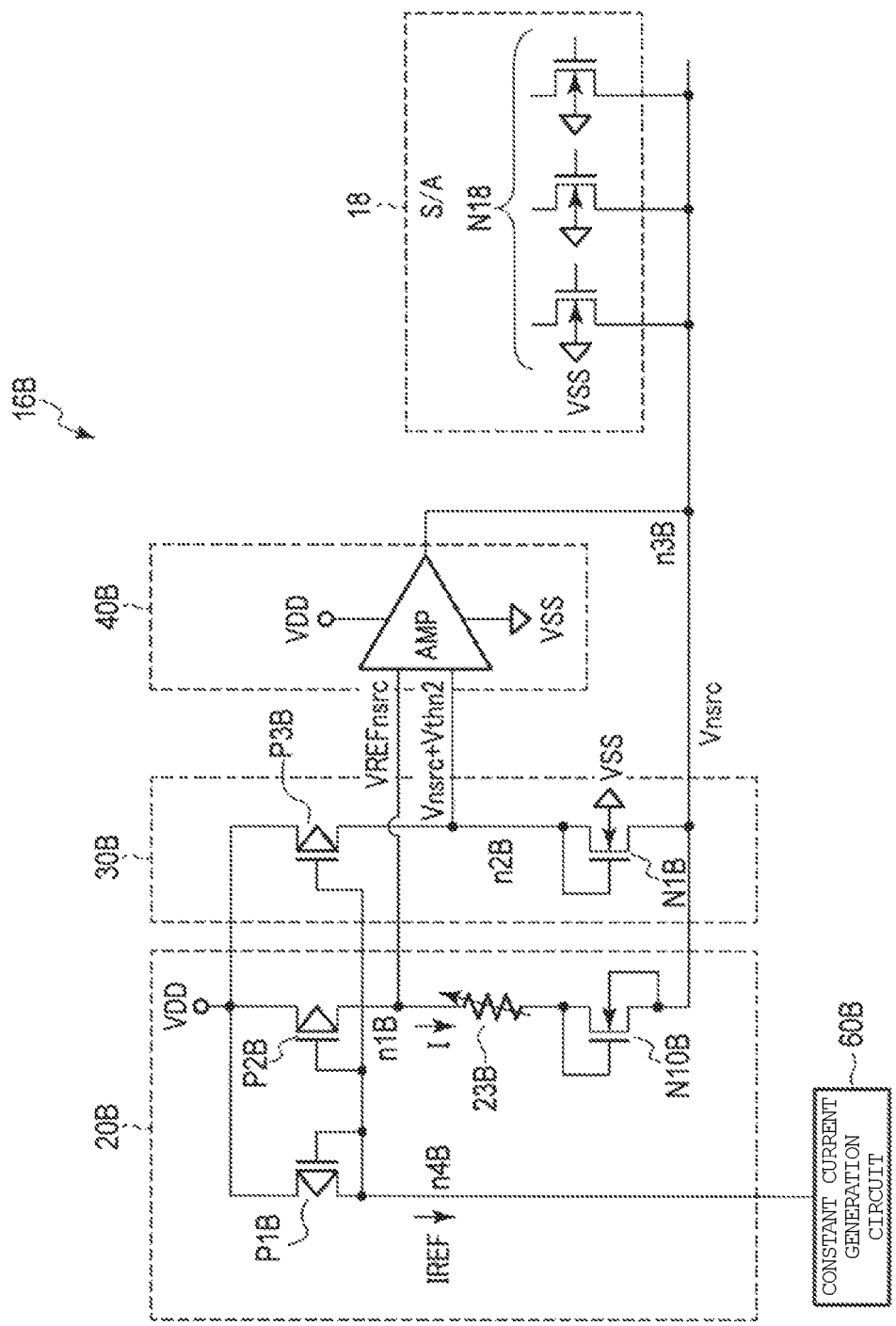
FIG. 24 is a diagram illustrating a substrate bias generation circuit of a semiconductor device according to an eighth embodiment.

FIG. 24 is a diagram illustrating a substrate bias generation circuit 16B of the semiconductor device 100 according to the eighth embodiment.

As illustrated in FIG. 24, the substrate bias generation circuit 16B includes a reference voltage generation circuit 20B, a monitoring voltage generation circuit 30B, and an amplification circuit 40B.

The reference voltage generation circuit 20B includes PMOS transistors P1B and P2B, an NMOS transistor N10B, and a resistor 23B. One terminal and a substrate of the NMOS transistor N10B are electrically connected to each other, and are electrically connected to a node n3B. The other terminal and a gate of the NMOS transistor N10B are diode-connected, and are electrically connected to one terminal of the resistor 23B. The other terminal of the resistor 23B is electrically connected to a node n1B.

The monitoring voltage generation circuit 30B includes a PMOS transistor P3B and an NMOS transistor N1B. One terminal (source) of the NMOS transistor N1B is electrically connected to a node n3B. The other terminal and a gate of the NMOS transistor N1B are diode-connected, and are electrically connected to a node n2B. The ground voltage VSS is supplied to a substrate of the NMOS transistor N1B.

A first input terminal of the amplification circuit 40B is electrically connected to the node n1B, and a second input terminal of the amplification circuit 40B is electrically connected to the node n2B. An output terminal of the amplification circuit 40B is electrically connected to the node n3B. The node n3B is electrically connected to the one terminal (source) of the NMOS transistor N1B of the monitoring voltage generation circuit 30B. In addition, the node n3B is electrically connected to sources of NMOS transistor N18 of the sense amplifier 18 or the like. The ground voltage VSS is supplied to a substrate of the NMOS transistors N18.

Operation Example of Eighth Embodiment

Next, an operation example of the substrate bias generation circuit 16B of the semiconductor device 100 according to the eighth embodiment will be described.

An operation of the substrate bias generation circuit 16B will be described with reference to FIG. 24.

In the eighth embodiment, the reference voltage generation circuit 20B generates a reference voltage VREFnsrc (voltage Vnsrc+(Vthn1+IR)), based on a constant current I. The monitoring voltage generation circuit 30B monitors a threshold voltage Vthn2 of the NMOS transistor N1B which is a replica, and generates a monitoring voltage Vnsrc+Vthn2. The amplification circuit 40B compares the reference voltage VREFnsrc with the monitoring voltage Vnsrc+Vthn2, and generates a source voltage Vnsrc such that the reference voltage VREFnsrc is equal to the monitoring voltage Vnsrc+Vthn2, based on the comparison result. A substrate bias of the NMOS transistors N1B and N18 is adjusted by the source voltage Vnsrc. Hereinafter, the operation of the substrate bias generation circuit 16B will be described in more detail.

As illustrated in FIG. 24, a constant current I based on the constant current IREF flows through a path including the PMOS transistor P2B, the resistor 23B, and the NMOS transistor N10B in the reference voltage generation circuit 20B. Thereby, a voltage Vnsrc+(Vthn1+IR) which increases by the threshold voltage Vthn1 and the voltage IR from the source voltage Vnsrc of the node n3B is applied to the node n1B. The voltage Vnsrc+(Vthn1+IR) becomes the reference voltage VREFnsrc.

Meanwhile, the PMOS transistors P1B and P3B form a current mirror circuit. Accordingly, the constant current based on the constant current IREF flows through a path including the NMOS transistor N1B and the PMOS transistor P3B. In addition, the NMOS transistor N1B is diode-connected. Accordingly, the monitoring voltage Vnsrc+Vthn2 which increases by the threshold voltage Vthn2 of the NMOS transistor N1B from the source voltage Vnsrc of the node n3B is applied to the node n2B.

The reference voltage VREFnsrc (voltage Vnsrc+(Vthn1+IR)) is supplied to the first input terminal of the amplification circuit 40B, and the monitoring voltage Vnsrc+Vthn2 is supplied to the second input terminal of the amplification circuit 40B. The amplification circuit 40B adjusts the substrate bias of the NMOS transistor N1B, such that the voltage Vnsrc+(Vthn1+IR) is equal to the monitoring voltage Vnsrc+Vthn2, that is, such that the threshold voltage Vthn2 is equal to the voltage (Vthn1+IR). More specifically, the amplification circuit 40B generates the source voltage Vnsrc, and feeds back the source voltage Vnsrc to a source of the NMOS transistor N1B. A voltage range is VSS≤Vnsrc≤VDD.

There is a case where the source voltage Vnsrc needs to be equal to or lower than VDD−Vthn so as to operate the NMOS transistor N1B. Accordingly, a clamp circuit which adjusts the voltage range of the source voltage Vnsrc may be provided between the amplification circuit 40B and the node n3B.

Because the source voltage Vnsrc is applied to the source of the NMOS transistor N1B, the threshold voltage Vthn2 of the NMOS transistor N1B is equal to the voltage Vthn1+IR.

Effects of Fourth Embodiment

According to the eighth embodiment, the substrate bias generation circuit 16B adjusts the source voltage (substrate bias), thereby shifting the threshold voltage Vthn2 of the NMOS transistor N1B with temperature characteristics by using the threshold voltage Vthn1 of the NMOS transistor N10B with the same temperature characteristics as a reference. At this time, the amounts of shift of the threshold voltage Vthn2 is determined by the voltage IR, that is, the resistance value R of the resistor 23B. Accordingly, it is possible to obtain the same effects as in the sixth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first circuit configured to generate a first voltage based on a first current;
a second circuit that includes a first transistor of a first conductivity type having a first terminal, a second terminal, and a first gate, the second circuit configured to generate a second voltage based on a voltage difference between the first terminal and the second terminal; and
a third circuit configured to compare the first voltage and the second voltage, and generate a third voltage for adjusting a substrate bias of the first transistor, based on the comparison result,
wherein the third voltage is supplied to the first terminal.

2. The device according to claim 1,
wherein the second circuit further includes a second transistor of a second conductivity type, the second transistor including a third terminal, a fourth terminal, and a second gate, and
wherein the third terminal is connected to the second terminal and the first gate.

3. The device according to claim 2, wherein the first circuit includes
a third transistor of the second conductivity type, the third transistor including a fifth terminal, a sixth terminal, and a third gate, and
a resistor that includes a seventh terminal and an eighth terminal, the seventh terminal being connected to the fifth terminal.

4. The device according to claim 3,
wherein the first circuit further includes a fourth transistor of the first conductivity type which includes a ninth terminal, a tenth terminal, and a fourth gate,
wherein the ninth terminal and the fourth gate are connected to the eighth terminal, and
wherein the tenth terminal is connected to a well of the fourth transistor.

5. The device according to claim 4, wherein the third circuit includes
a fifth transistor of the first conductivity type which includes an eleventh terminal, a twelfth terminal, and a fifth gate, the eleventh terminal being connected to the fifth gate,
a sixth transistor of a second conductivity type different from the first conductivity type, which includes a thirteenth terminal, a fourteenth terminal, and a sixth gate, the thirteenth terminal being connected to the eleventh terminal,
a seventh transistor of the first conductivity type, which includes a fifteenth terminal, a fifteenth terminal, and a seventh gate, the seventh gate being connected to the fifth gate, and
an eighth transistor of the second conductivity type, which includes a seventeenth terminal, an eighteenth terminal, and an eighth gate, the seventeenth terminal being connected to the fifteenth terminal.

6. The device according to claim 1,
wherein the third circuit includes an amplification circuit and a clamp circuit, the amplification circuit generating an interim voltage based on the comparison result and the clamp circuit generating the third voltage based on the interim voltage.

7. The device according to claim 1, wherein the first current is supplied from a constant current source.

8. A semiconductor device comprising:
a memory cell array;
a sense amplifier electrically connected to memory cells of the memory cell array and including a first transistor of a first conductivity type having a first terminal, a second terminal, and a first gate; and
a voltage generation circuit configured to supply voltages to the sense amplifier, and
wherein one of the voltages supplied by the voltage generation circuit is a bias voltage for adjusting a substrate bias of the first transistor to cause a threshold voltage of the first transistor to be substantially constant across different temperatures, and
wherein the voltage generation circuit includes
a first circuit configured to generate a first voltage based on a first current, a second circuit that includes a second transistor of the first conductivity type having a third terminal, a fourth terminal, and a second gate, the second circuit configured to generate a second voltage based on a voltage difference between the third terminal and the fourth terminal, and a third circuit configured to compare the first voltage and the second voltage, and generate the bias voltage for adjusting the substrate bias of the first and second transistors, based on the comparison result, the third circuit including an amplification circuit and a clamp circuit, the amplification circuit generating an interim voltage based on the comparison result and the clamp circuit generating the third voltage based on the interim voltage.

9. The device according to claim 8, wherein the bias voltage is supplied to a well of the first transistor.

10. The device according to claim 8, wherein the bias voltage is supplied to the first terminal.

11. A semiconductor device comprising:
a first circuit configured to generate a first voltage based on a first current;
a second circuit that includes a first transistor of a first conductivity type having a first terminal, a second terminal, and a first gate, the second circuit configured to generate a second voltage based on a voltage difference between the first terminal and the second terminal; and
a third circuit configured to compare the first voltage and the second voltage, and generate a third voltage for adjusting a substrate bias of the first transistor, based on the comparison result,
wherein the third circuit includes an amplification circuit and a clamp circuit, the amplification circuit generating an interim voltage based on the comparison result and the clamp circuit generating the third voltage based on the interim voltage.

12. The device according to claim 11,
wherein the second circuit further includes a second transistor of a second conductivity type, the second transistor including a third terminal, a fourth terminal, and a second gate, and
wherein the third terminal is connected to the second terminal and the first gate.

13. The device according to claim 12, wherein the first circuit includes
a third transistor of the second conductivity type, the third transistor including a fifth terminal, a sixth terminal, and a third gate, and
a resistor that includes a seventh terminal and an eighth terminal, the seventh terminal being connected to the fifth terminal.

14. The device according to claim 13,
wherein the first circuit further includes a fourth transistor of the first conductivity type which includes a ninth terminal, a tenth terminal, and a fourth gate,
wherein the ninth terminal and the fourth gate are connected to the eighth terminal, and
wherein the tenth terminal is connected to a well of the fourth transistor.

15. The device according to claim 14, wherein the third circuit includes
a fifth transistor of the first conductivity type which includes an eleventh terminal, a twelfth terminal, and a fifth gate, the eleventh terminal being connected to the fifth gate,
a sixth transistor of a second conductivity type different from the first conductivity type, which includes a thirteenth terminal, a fourteenth terminal, and a sixth gate, the thirteenth terminal being connected to the eleventh terminal,
a seventh transistor of the first conductivity type, which includes a fifteenth terminal, a fifteenth terminal, and a seventh gate, the seventh gate being connected to the fifth gate, and
an eighth transistor of the second conductivity type, which includes a seventeenth terminal, an eighteenth terminal, and an eighth gate, the seventeenth terminal being connected to the fifteenth terminal.

16. The device according to claim 11, wherein the first current is supplied from a constant current source.

* * * * *